(12) United States Patent
Ohnuma

(10) Patent No.: US 6,670,225 B2
(45) Date of Patent: Dec. 30, 2003

(54) METHOD OF MANUFACTURING A SEMICONDUCTOR DEVICE

(75) Inventor: Hideto Ohnuma, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/242,732

(22) Filed: Sep. 13, 2002

(65) Prior Publication Data

US 2003/0008439 A1 Jan. 9, 2003

Related U.S. Application Data

(62) Division of application No. 09/123,000, filed on Jul. 28, 1998, now Pat. No. 6,465,288.

(30) Foreign Application Priority Data

Jul. 30, 1997 (JP) ............................................. 9-219955

(51) Int. Cl.⁷ ..................... H01L 21/336; H01L 21/322
(52) U.S. Cl. ..................... 438/166; 438/143; 438/486; 438/487
(58) Field of Search ..................... 438/166, 158, 438/162, 486, 487, 308, 143, 402, 473, 476, 471, 918

(56) References Cited

U.S. PATENT DOCUMENTS

| | | | |
|---|---|---|---|
| 5,643,826 A | 7/1997 | Ohtani et al. | |
| 5,648,277 A | 7/1997 | Zhang et al. | |
| 5,675,176 A | 10/1997 | Ushiku | |
| 5,700,333 A | 12/1997 | Yamazaki | |
| 5,830,784 A | 11/1998 | Zhang | |
| 5,874,325 A | 2/1999 | Koike | |
| 5,932,893 A | 8/1999 | Miyanaga | |
| 5,985,740 A | 11/1999 | Yamazaki | |
| 6,074,901 A | 6/2000 | Ohtani et al. | |
| 6,087,679 A | 7/2000 | Yamazaki | |
| 6,093,587 A | 7/2000 | Ohtani | |
| 6,121,660 A | 9/2000 | Yamazaki | |
| 6,140,166 A | 10/2000 | Ohtani | |
| 6,140,667 A | 10/2000 | Yamazaki | |
| 6,153,445 A | 11/2000 | Yamazaki et al. | |
| 6,156,628 A | 12/2000 | Ohnuma et al. | |
| 6,162,704 A | 12/2000 | Yamazaki et al. | |
| 6,165,824 A | 12/2000 | Takano et al. | |
| 6,197,624 B1 | 3/2001 | Yamazaki | |
| 6,197,626 B1 | 3/2001 | Yamazaki et al. | |
| 6,436,745 B1 * | 8/2002 | Gotou et al. | 438/166 |
| 6,465,288 B1 * | 10/2002 | Ohnuma | 438/166 |
| 6,479,333 B1 * | 11/2002 | Takano et al. | 438/166 |
| 6,489,189 B2 * | 12/2002 | Yamazaki et al. | 438/166 |
| 6,555,448 B2 * | 4/2003 | Fukushima | 438/166 |

FOREIGN PATENT DOCUMENTS

| | | |
|---|---|---|
| JP | 7-130652 | 5/1995 |
| JP | 7-135318 | 5/1995 |

* cited by examiner

*Primary Examiner*—Mary Wilczewski
(74) *Attorney, Agent, or Firm*—Eric J. Robinson; Robinson Intellectual Property Law Office, P.C.

(57) ABSTRACT

After a catalyst element is introduced into an amorphous silicon film, the amorphous silicon film is converted into a crystalline silicon film by a heat treatment and laser irradiation. After a resist mask is formed on the crystalline silicon film, boron and phosphorus are selectively introduced into the crystalline silicon film to form a gettering region therein. Then, a heat treatment is performed at 500°–650° C., whereby the catalyst element in a gettering subject region is gettered to the gettering region. As a result, a crystalline semiconductor film is obtained in which the catalyst element concentration is reduced. The crystalline semiconductor film is patterned into a semiconductor layer of a semiconductor device.

30 Claims, 18 Drawing Sheets

N-CHANNEL TFT            P-CHANNEL TFT

N-CHANNEL TFT     P-CHANNEL TFT

N-CHANNEL TFT          P-CHANNEL TFT

| FIG. | P CONCENTRATION (atoms/cm$^2$) | B CONCENTRATION (atoms/cm$^2$) |
|---|---|---|
| FIG. 12 | 0 | 2.5 x 10$^{15}$ |
| FIG. 13 | 1.7 x 10$^{15}$ | 0 |
| FIG. 14 | 1.7 x 10$^{15}$ | 2.5 x 10$^{15}$ |
| FIG. 15 | 1.7 x 10$^{15}$ | 8.3 x 10$^{14}$ |
| FIG. 16 | 1.7 x 10$^{15}$ | 1.7 x 10$^{15}$ |

(Acceleration voltages of both P and B are 10 kV.)

s = 10μm 10   20 s = 50μm 10   20 s = 20μm 10   20 s = 100μm 10   20 s = 30μm 10   20

DOPING CONDITION
P: NO DOPING
B: 10 kV, 2.5 x $10^{15}$ atoms/cm$^2$ s = 10μm 10    20 s = 50μm 10    20 s = 20μm 10    20 s = 100μm 10   20 s = 30μm 10    20

DOPING CONDITION
P: 10 kV, $1.7 \times 10^{15}$ atoms/cm$^2$
B: NO DOPING s = 10μm 10  20 s = 50μm 10  20 s = 20μm 10  20 s = 100μm 10  20 s = 30μm 10  20

DOPING CONDITION
P: 10 kV, 1.7 x $10^{15}$ atoms/cm$^2$
B: 10 kV, 2.5 x $10^{15}$ atoms/cm$^2$ s = 10μm 10  20 s = 20μm 10  20 s = 30μm 10  20 s = 50μm 10  20 s = 100μm 10  20

DOPING CONDITION
P: 10 kV, $1.7 \times 10^{15}$ atoms/cm$^2$
B: 10 kV, $8.3 \times 10^{14}$ atoms/cm$^2$ s = 10μm 10  20 s = 50μm 10  20 s = 20μm 10  20 s = 100μm 10  20 s = 30μm 10  20

DOPING CONDITION
P: 10 kV, 1.7 × $10^{15}$ atoms/$cm^2$
B: 10 kV, 1.7 × $10^{15}$ atoms/$cm^2$

METHOD OF MANUFACTURING A SEMICONDUCTOR DEVICE

This is a divisional of U.S. application Ser. No. 09/123,000, filed Jul. 28, 1998, now U.S. Pat. No. 6,465,288.

BACKGROUND OF THE INVENTION

1. Field of the Invention

The present invention relates to a manufacturing method of a semiconductor device using a crystalline semiconductor film that is formed by crystallizing an amorphous semiconductor thin film. In particular, the invention relates to a manufacturing method of such semiconductor devices as a thin-film transistor (TFT).

2. Description of the Related Art

In recent years, techniques of constructing a semiconductor circuit by forming TFTs on a glass substrate or the like have advanced rapidly. A typical example of such semiconductor circuits is an electro-optical device such as an active matrix liquid crystal display device.

The active matrix liquid crystal display device is a monolithic display device in which a pixel matrix circuit and driver circuits are provided on the same substrate. Further, the system-on-panel device which additionally incorporates a memory circuit and logic circuits such as a clock generation circuit is being developed.

Since driver circuits and logic circuits are required to operate at high speed, it is not appropriate for those circuits to use an amorphous silicon film as an active layer. Therefore, TFTs using a crystalline silicon film (polysilicon film) as an active layer are now becoming the mainstream.

On the other hand, researches and developments are now being made on what is called a low-temperature process, that is, a process for forming a crystalline silicon film over a large area on such a substrate as a glass substrate that is low in heat resistance than a quartz substrate.

The present inventors disclosed a technique of forming a crystalline silicon film on a glass substrate (see Japanese Patent Application Laid-open No. Hei. 7-130652). The technique disclosed in this publication is such that a catalyst element for accelerating crystallization is added to an amorphous silicon film and then the amorphous silicon is crystallized by a heat treatment.

This crystallization technique has made it possible to reduce the crystallization temperature of an amorphous silicon film by as much as 50°–100° C. and to reduce the crystallization time to $1/5$ to $1/10$ of the previous one. As a result, it has become possible to form a crystalline silicon film over a large area on a glass substrate that is low in heat resistance. It has been confirmed experimentally that a crystalline silicon film formed by such a low-temperature process has superior crystallinity.

In the above crystallization technique, metal elements such as nickel and cobalt are used as the catalyst element. Such a metal element forms deep energy levels in a silicon film and thereby captures carriers. Therefore, there is a possibility that the metal element adversely affects the electrical characteristics and the reliability of TFTs that are manufactured by using a crystalline silicon film containing the metal element.

It has been found that a catalyst element remaining in a crystalline semiconductor thin film segregates in an irregular manner, particular at grain boundaries. The inventors think that segregated regions serve as leak paths of faint current and possibly cause a sudden increase of an off-current (i.e., a current during an off-state of a TFT).

Therefore, it is desirable that the catalyst element be removed or reduced in concentration to such a level as not to influence the electrical characteristics at an early stage after the crystallization. The inventors have already filed an patent application that relates to a method of gettering a catalyst element in a crystalline silicon film by utilizing a gettering effect of a halogen element.

However, the this technique cannot be applied to a glass substrate that is low in heat resistance because a heat treatment needs to be performed at as high a temperature as 800° C. or more. Therefore, the features of the low-temperature process using a catalyst element cannot be used effectively.

SUMMARY OF THE INVENTION

The present invention has been made in view of the above problems in the art, and an object of the invention is therefore to provide a technique for removing a catalyst element from a crystalline semiconductor film containing silicon or reducing its concentration therein while the features of the low-temperature process are maintained.

To attain the above object, the invention provides a manufacturing method of a semiconductor device which mainly comprises: 1) a step of crystallizing an amorphous semiconductor film comprising silicon by utilizing a catalyst element; 2) a step of forming a gettering region by selectively doping a crystallized semiconductor film with a group-13 element (specifically, boron) and a group-15 element (specifically, phosphorus); 3) a step of performing a heat treatment to move the catalyst element in a gettering subject region to the gettering region. With execution of the above steps, the catalyst element in the region that was not doped with the group-13 element nor the group-15 element is diffused into the gettering region and gettered there.

The basic object of the invention is to remove, from a crystalline silicon film, a catalyst that has been used to crystallize an amorphous semiconductor film containing silicon. To this end, a region in which a group-13 element and a group-15 element are introduced is used as a gettering sink.

In the above-mentioned crystallizing step, a catalyst element may be introduced into an amorphous silicon film by vapor-phase methods such as plasma doping, evaporation, and sputtering, or a method of applying a solution containing a catalyst element. In the method of using a solution, the amount of introduction of a catalyst element can be controlled easily and the catalyst element can easily be added at a very small amount.

Examples of the catalyst element are metal elements such as Ni (nickel), Co (cobalt), Fe (iron), Pd (palladium), Pt (platinum), Cu (copper), and Au (gold). Experiments of the inventors have revealed that nickel is the most suitable element.

In the invention, the group-13 impurity element for gettering is at least one element selected from B, Al, Ga, In, and Tl. B (boron) is the most suitable for this purpose. Examples of the group-15 impurity element are N (nitrogen), P (phosphorus), As (arsenic), Sb (antimony), and Bi (bismuth). Phosphorus exhibits the most remarkable effect and arsenic is the second.

A technique is known in which an n-type region containing diffused phosphorus is used as a gettering sink for gettering a metal element that has diffused in a single crystal silicon substrate. In contrast, the invention has a feature that a region in which a group-13 element for imparting p-type conductivity to a semiconductor material as well as a group-15 element for imparting n-type conductivity to it is introduced is used as a gettering sink for gettering a catalyst element that has been added intentionally for crystallization.

DETAILED DESCRIPTION OF THE PREFERRED EMBODIMENTS

There are six typical parameters to be considered for the gettering step of the invention:

(a) the doses in boron and phosphorus introduction steps;

(b) the acceleration voltages in the boron and phosphorus introduction steps;

(c) the shape and the area of a gettering region;

(d) the shape and the area of a gettering subject region;

(e) the process temperature of a heat treatment for gettering; and (f) the process time of the heat treatment for gettering.

In the invention, the above parameters are interrelated with each other; if the value of one parameter is changed, the optimum values of the other parameters vary accordingly. Experiments conducted by the inventors and knowledge obtained by the experiments will be described below.

The experiments are outlined as follows. There were formed (a) a gettering region in which only phosphorus (group-15 element) was introduced, (b) a gettering region in which only boron (group-13 element) was introduced, and (c) a gettering region in which phosphorus and boron were introduced, and the gettering effects of the respective regions were compared with each other and studied.

In the experiments, to compare the effects of the respective gettering regions, samples that had been subjected to a gettering step were processed with an etchant called FPM (a liquid chemical obtained by mixing HF and $H_2O_2$ at a mole ratio of 0.5:0.5). By performing an FPM treatment, nickel remaining (probably in the form of nickel silicide) in a gettering subject region can be removed selectively. Therefore, the gettering effect was evaluated by the number of holes that were generated by the FPM treatment. Such holes are generated by immersing a sample in an FPM liquid for 1 hour at room temperature. It can be said that the nickel concentration is higher when a larger number of holes are generated.

In the experiments, all of polycrystalline silicon film samples were produced under the following conditions. A nickel acetate salt solution containing nickel at 10 ppm was applied to the surface of a 55-nm-thick amorphous silicon film by spin coating. After it was heated at 550° C. for 4 hours, annealing was performed by irradiation with excimer laser light. According to a SIMS measurement, the nickel concentration of a resulting polysilicon film was about $1 \times 10^{19}$ to $2 \times 10^{19}$ atoms/cm$^3$.

Figures 10, 11:
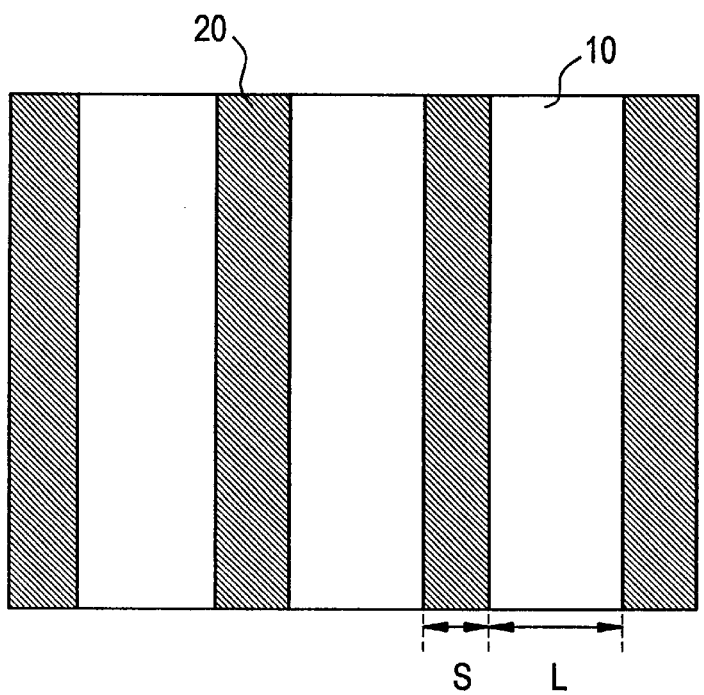
FIG. 10 schematically shows a sample.
FIG. 11 shows doping conditions of samples that are shown in FIGS. 12–16.
Figure 12A:
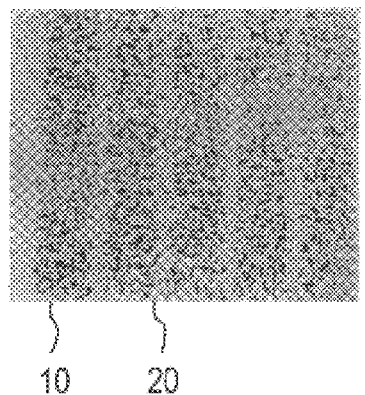
FIGS. 12A–12E to FIGS. 16A–16E are optical microscope photographs of respective samples that were subjected to an FPM treatment.
Figure 12D:
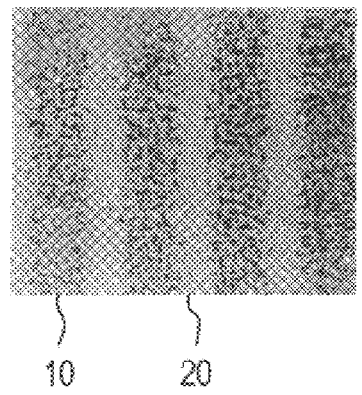
Figure 12B:
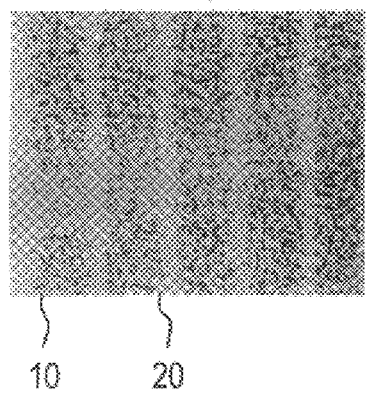
Figure 12E:
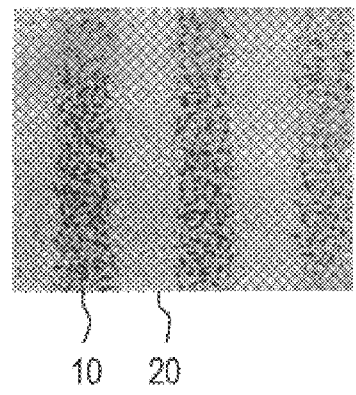
Figure 12C:
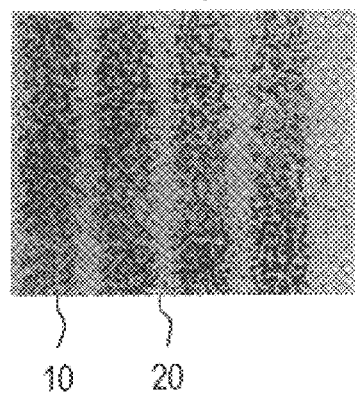
Figure 13A:
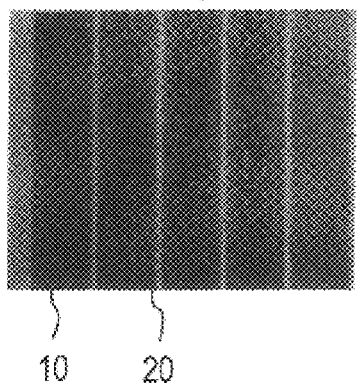
Figure 13D:
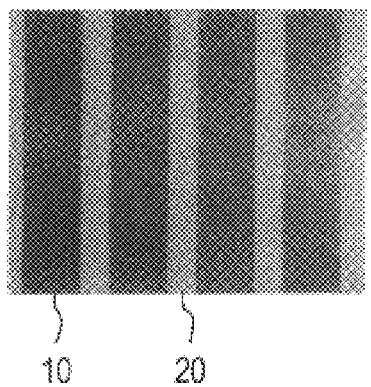
Figure 13B:
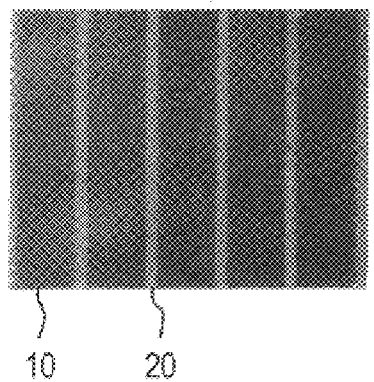
Figure 13E:
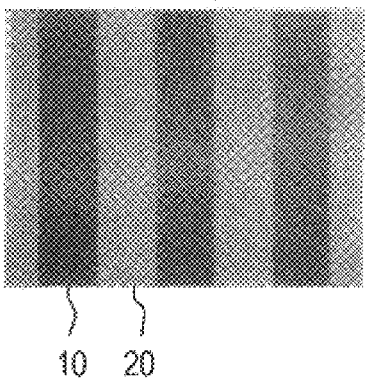
Figure 13C:
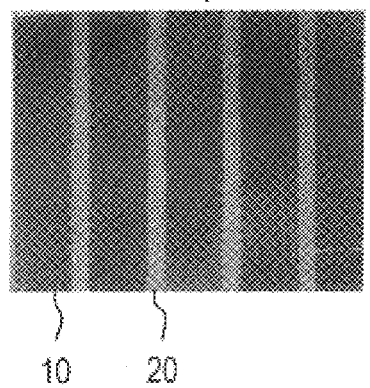

FIG. 10 schematically shows a relationship between gettering subject regions 10 and gettering regions 20 in the experiments. Then, a mask was formed on the polysilicon film, and gettering regions 20 were formed by selectively doping the polysilicon film with phosphorus and/or boron through the mask by ion doping. Regions that were not doped with phosphorus nor boron are called gettering subject regions 10. Phosphine and diborane were used as source gases of phosphorus and boron, respectively.

In the experiments, as for the conditions of a heat treatment for gettering, the heat treatment was consistently performed at 600° C. for 12 hours in a nitrogen atmosphere. The above-mentioned FPM treatment was performed after this heat treatment. FIGS. 12A–12E to 16A–16E are optical microscope photographs of samples taken after the FPM process.

FIGS. 12A–12E to 16A–16E show results of an experiment in which the width L of each gettering subject region was fixed at 100 µm and the width s of each gettering region 20 was set at 10, 20, 30, 50, and 100 µm. The FPM liquid can selectively remove an n-type silicon film while leaving an intrinsic silicon film. Therefore, in the case of FIGS. 13A–13E, the gettering regions 20 in which only phosphorus had been introduced were removed. FIG. 11 is a table showing a correlation between the sets of optical microscope photographs and doping conditions for forming gettering regions 20.

FIGS. 12A–12E are optical microscope photographs in a case where only boron (group-13 element) was introduced. As for the boron doping conditions, the acceleration voltage was set at 10 kV and the dose was so set that the gettering regions 20 would have a boron concentration $2.5 \times 10^{15}$ atoms/cm$^2$.

FIGS. 13A–13E are optical microscope photographs in a case where only phosphorus (group-15 element) was introduced. As for the phosphorus doping conditions, the acceleration voltage was set at 10 kV and the dose was so set that the gettering regions 20 would have a phosphorus concentration $1.7 \times 10^{15}$ atoms/cm$^2$.

FIGS. 14A–14E are optical microscope photographs in a case where boron and phosphorus (a group-13 element and a group-15 element, respectively) were introduced. The boron doping conditions were the same as in the case of FIGS. 12A–12E and the phosphorus doping conditions were the same as in the case of FIGS. 13A–13E.

Results of a comparison among FIGS. 12A–12E to FIGS. 14A–14E are as follows. The photographs of FIGS. 12A–12E show that there are no differences between the numbers of holes before and after the heat treatment for gettering. This leads to a conclusion that the gettering regions 20 doped with only boron have almost no gettering effect.

On the other hand, by comparing the photographs of FIGS. 13A–13E with those of FIGS. 12A–12E, it is seen that the gettering regions 20 doped with only phosphorus have a gettering function. However, when the width s of the gettering regions 20 was as small as 10 μm or 20 μm, holes were generated in the gettering subject regions 10. On the other hand, in the photographs of FIGS. 14A–14E in which the gettering regions 20 were doped with both boron and phosphorus, holes were not generated in the gettering subject regions 10 even when the width s of the gettering regions 20 was as small as 10 μm or 20 μm. In the samples in which holes were not generated by the FPM treatment, the nickel concentration was as low as the SIMS detection lower limit concentration (about $5 \times 10^{17}$ atoms/cm$^3$ or less).

The gettering that is utilized in the invention is a catalyst element diffusion phenomenon. In the experiments, the nickel diffusion length depends on the width L of the gettering subject regions 10. Assuming a simplified model in which nickel diffusion occurs one-dimensionally, that is, only in the direction of the width L of the gettering subject regions 10, if the width L is 100 μm it is sufficient to cause nickel to diffuse over 50 μm at the maximum. In the cases of FIGS. 13A–13E and 14A–14E in which the width L of the gettering subject regions 10 are the same (100 μm), the diffusion lengths of nickel to be covered until being gettered are considered the same. It is expected that the gettering effect is enhanced as the gettering regions 20 become wider. This is evidenced by the photographs of FIGS. 13A–13E.

Figure 14A:
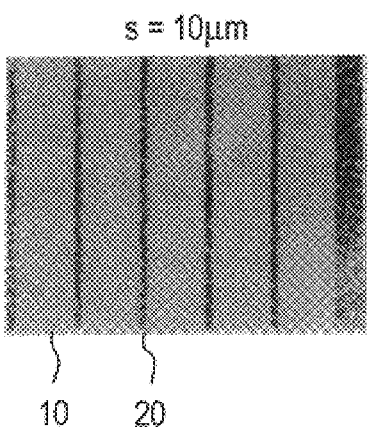
Figure 14D:
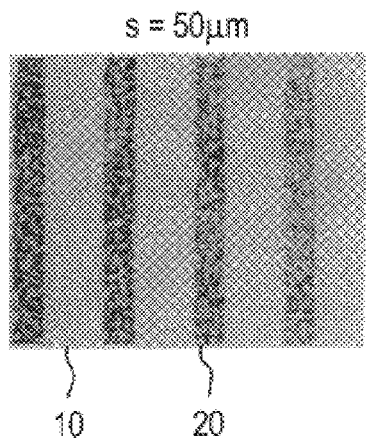
Figure 14B:
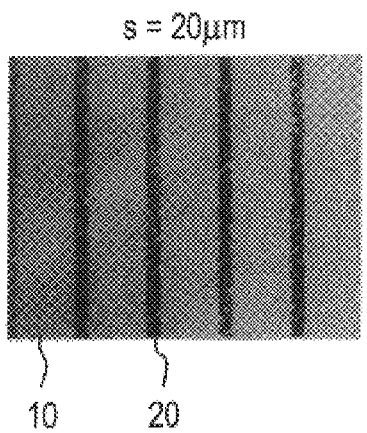
Figure 14E:
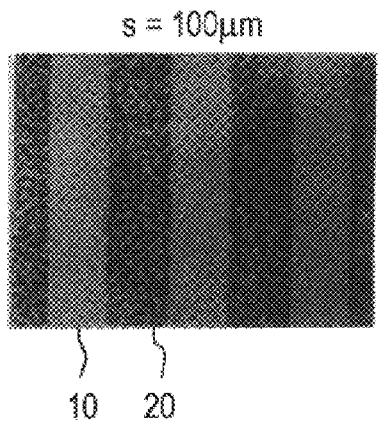
Figure 14C:
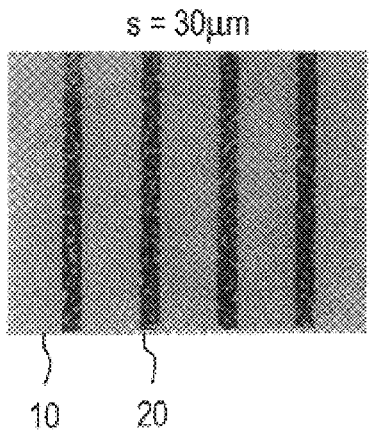
Figure 15A:
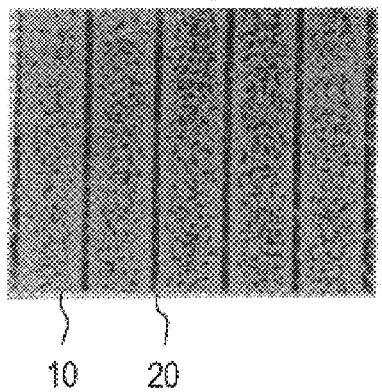
Figure 15B:
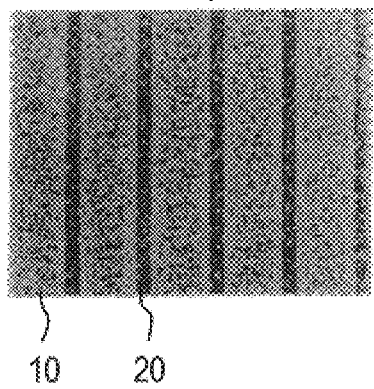
Figure 15C:
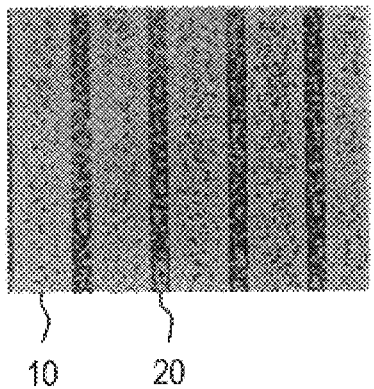
Figure 15D:
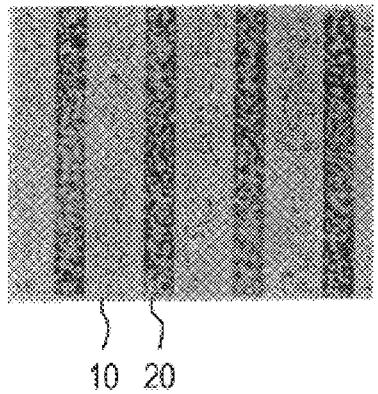
Figure 15E:
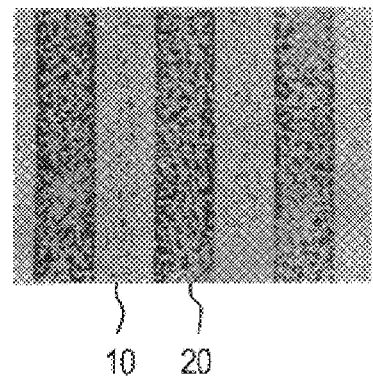
Figure 16A:
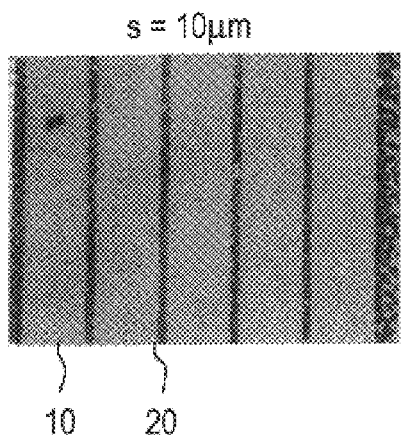
Figure 16D:
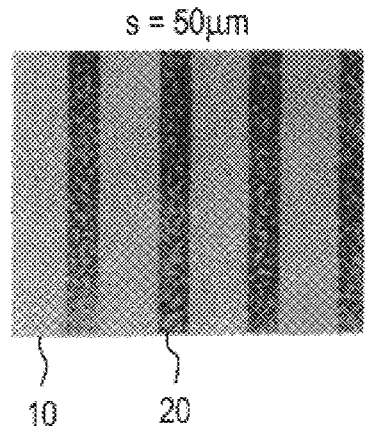
Figure 16B:
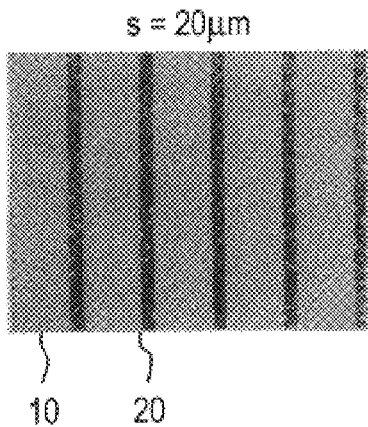
Figure 16E:
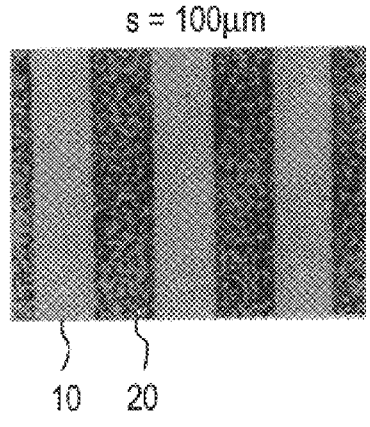
Figure 16C:
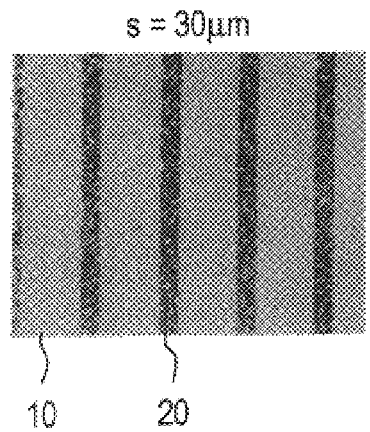

Therefore, the comparison between the photographs of FIGS. 13A–13E and those of FIGS. 14A–14E leads to a conclusion that the gettering regions 20 doped with both boron and phosphorus and having even smaller areas can getter nickel atoms that are more distant therefrom than the gettering regions 20 doped with only phosphorus. That is, the former have a higher gettering effect than the latter. In particular, the photograph of FIG. 14A shows that a satisfactory result can be obtained by forming gettering regions 20 having a width s of 5 μm on both sides of each gettering subject region 10 having a width L of 100 μm.

Where both boron and phosphorus are used, the occupation area of the gettering regions 20 can be small and hence the gettering subject regions 10 can be made wider. Further, because of a high gettering effect, an advantage is obtained that the gettering process time can be shortened. One reason why the gettering regions 20 doped with both phosphorus and boron provide a higher gettering effect than those doped with only phosphorus would be that the former have a high nickel solid solubility.

Another experiment was performed in which the phosphorus doping conditions were fixed and the boron doping conditions were varied to observe a relationship between the boron introduction amount and the gettering effect. FIGS. 15A–15E and 16A–16E are optical microscope photographs of samples after being subjected to an FPM treatment. In this experiment, the phosphorus doping conditions were set the same as in the case of FIGS. 13A–13E; the acceleration voltage was set at 10 kV and the dose was so set as to provide a phosphorus concentration $1.7 \times 10^{15}$ atoms/cm$^2$. The acceleration voltage at the time of boron doping was also fixed at 10 kV.

FIGS. 15A–15E are optical microscope photographs in a case where the boron dose was so set as to provide a boron concentration $8.3 \times 10^{14}$ atoms/cm$^2$ that is approximately a half of the phosphorus concentration. FIGS. 16A–16E are optical microscope photographs in a case where the boron dose was so set as to provide a boron concentration $1.7 \times 10^{15}$ atoms/cm$^2$ that is the same as the phosphorus concentration.

The case of FIGS. 14A–14E corresponds to a case of this experiment with a boron concentration $2.5 \times 10^{15}$ atoms/cm and the case of FIGS. 13A–13E corresponds to a case of this experiment with a boron concentration 0.

It is seen from the photographs of FIGS. 15A–15E that the gettering effect in a case where the concentration of doped boron is lower than the concentration of doped phosphorus is lower than in a case where only phosphorus is introduced (see FIGS. 13A–13E).

It is seen from the photographs of FIGS. 16A–16E that by setting the doses so that the concentration of doped boron was the same as that of doped phosphorus ($1.7 \times 10^{15}$ atoms/cm$^2$), almost no holes were formed by the FPM treatment even if the width s was 10 μm or 20 μm, that is, a higher gettering effect was obtained than in the case where only phosphorus was introduced (see FIGS. 13A–13E).

However, as seen from FIGS. 16A–16E, in the case where the boron concentration was $1.7 \times 10^{15}$ atoms/cm$^2$, a small number of holes were formed in the gettering subject regions 10 when the width s was 10 μm, 20 μm, or 30 μm.

On the other hand, when the boron concentration was $2.5 \times 10^{15}$ atoms/cm$^2$ that was higher than the phosphorus concentration, holes were not generated even when the width s was 10 μm as seen from FIG. 14A.

In the above experiment, the phosphorus dose was fixed at such a value as to provide a phosphorus concentration $1.7 \times 10^{15}$ atoms/cm$^2$. Another experiment was conducted in which the phosphorus dose was so set as to provide a phosphorus concentration $8.3 \times 10^{14}$ atoms/cm$^2$ that was approximately a half of the above value and the acceleration voltage was fixed at 10 kV. As for the boron doping conditions, the acceleration voltage was set at 10 kV and the dose was so set as to provide boron concentrations 0, $8.3 \times 10^{14}$ atoms/cm$^2$, and $1.7 \times 10^{15}$ atoms/cm$^2$. Gettering effects of the respective cases were compared with each other. The gettering effect in the case where the phosphorus concentration was $8.3 \times 10^{14}$ atoms/cm$^2$ and boron was added was lower than in the case where only phosphorus was added (i.e., the boron dose was 0).

The above experimental results are summarized as follows. To use gettering regions 20 doped with both phosphorus and boron, the phosphorus dose should be so set as to provide a phosphorus concentration of $1.7 \times 10^{15}$ atoms/cm$^2$ or more in a case where the nickel concentration in gettering subject regions 10 is about $1 \times 10^{19}$ to $2 \times 10^{19}$ atoms/cm$^3$. The boron dose should be so set as to provide a boron concentration of $1.7 \times 10^{15}$ atoms/cm or more. It is even preferable that phosphorus be added at a concentration higher than $2.5 \times 10^{15}$ atoms/cm$^2$ that is about 1.5 times the phosphorus concentration.

The boron and phosphorus concentration values in the above experiments are ones derived from the dose values. Concentrations of boron and phosphorus introduced in actual gettering regions 20 were measured by SIMS. SIMS measurement results were such that the concentration per unit area of phosphorus in the gettering regions 20 when the acceleration voltage was set at 10 kV and the phosphorus dose was so set as to provide a phosphorus concentration $1.7 \times 10^{15}$ atoms/cm$^2$ was approximately equal to that of boron in the gettering regions 20 when the acceleration voltage was set at 10 kV and the boron dose was so set as to provide a boron concentration $1.7 \times 10^{15}$ atoms/cm$^2$, and they were about $1.5 \times 10^{15}$ to $2 \times 10^{15}$ atoms/cm$^2$.

Each of the above phosphorus and boron concentrations per unit area is an area-converted value of a SIMS concentration profile (a concentration per unit volume [atoms/cm$^3$] that varies in the depth (film thickness) direction).

Therefore, to provide a state that holes are not generated by the FPM treatment in gettering subject regions having a nickel concentration of about $1\times10^{19}$ to $2\times10^{19}$ atoms/cm$^3$, the concentrations in unit area of phosphorus and boron in gettering areas 20 should be $1.5\times10^{15}$ atoms/cm$^2$ or more. On the other hand, the boron concentration per unit area should be equal to or higher than the phosphorus concentration per unit area (about one time that of phosphorus or more); from the viewpoint of productivity, the former should be about 1–3 times the latter. Based on the comparison among the experimental results of FIGS. 14A–14E and 16A–16E, it is concluded that the concentration in unit area of boron should be about 1.5–3 times that of phosphorus. That is, the phosphorus and boron concentrations in gettering regions 20 should be so set that the gettering regions 20 substantially exhibit p-type conductivity.

The above conditions on the phosphorus and boron doses that have been obtained from the experimental results of FIGS. 12A–12E to 16A–16E are ones to be applied to the case where the nickel concentration of a polysilicon film is about $1\times10^{19}$ to $2\times10^{19}$ atoms/cm$^3$. However, for cases where the nickel concentration is out of the above range, it is expected that gettering regions 20 doped with both phosphorus and boron so that the boron concentration is about one time the phosphorus concentration or more (preferably about 1.5–3 times the latter) can provide a higher gettering effect than gettering regions 20 doped with only phosphorus. It is also expected that if the nickel concentration is lower than the above range, the lower limit of the phosphorus concentration of the gettering regions 20 will shift to the low-concentration side.

The method of introducing boron and phosphorus is not limited to vapor-phase methods such as ion doping and plasma doping and there may be used a method in which a layer containing boron and/or phosphorus is formed by a solid-phase method or a liquid-phase method that uses a solution.

Under the conditions of the above experiments, gettering can be performed as long as the width L of the gettering subject regions 10 is 100 µm. Semiconductor layers having a size in which each side is about 100-µm long can be obtained from a pattern of those gettering subject regions 10. This is one (a particularly large one) of sizes of semiconductor layers of TFTs that constitute actual active matrix display devices. Therefore, the knowledge obtained from the above experiments is substantially applicable to all TFTs to constitute active matrix display devices.

An active layer of such a large size that the length of the shorter side is more than 100 µm is used for only TFTs to constitute a driver circuit, for instance. The use of such a large active layer can easily be avoided by, for example, using a plurality of semiconductor layers.

Although in the above experiments the heating temperature and time were set at 600° C. and 12 hours, the diffusion length of the catalyst element such as nickel depends on the heating temperature and time; the diffusion length increases as the heating temperature is made higher or the heating time is made longer. The heat treatment is completed in a shorter time when the width L of the gettering subject regions 10 is smaller.

Theoretically, the lower limit of the heating temperature can be determined as a lowest temperature at which the catalyst element such as nickel can diffuse, and its upper limit is determined as a highest temperature at which phosphorus and boron introduced in the gettering regions 20 do not make a reverse diffusion to the gettering subject regions 10. That is, the heating temperature range is 400°–1,050° C., preferably 400°–900° C.

For example, a typical heating temperature is 550°–650° C. when a glass substrate is used, and is 600°–750° C. when a quartz substrate is used.

On the other hand, the heating time is determined from such factors as the heating temperature and the catalyst element diffusion length. In view of the throughput of a manufacturing process, an unduly long process time is not preferable. In view of the throughput, the inventors set 24 hours as the upper limit of the heating time. That is, the heating time should be in a range of 1 minute to 24 hours, preferably 30 minutes to 3 hours.

The heat treatment atmosphere may be one of an inert atmosphere, a hydrogen atmosphere, an oxidizing atmosphere, and an oxidizing atmosphere containing a halogen element.

The gettering effect is enhanced when the doping with phosphorus and boron is performed at a relatively low acceleration voltage of 5–30 kV. This is considered due to a phenomenon that when the dose is fixed, such a low acceleration voltage causes phosphorus and boron to be introduced at high concentrations into a semiconductor film that is to be used as semiconductor layers of TFTs and is as thin as hundreds of nanometers.

A method, other than the heat treatment of a high temperature and a long time, for causing a larger amount of catalyst element such as nickel to diffuse over a longer distance in the gettering step is to apply laser light (preferably pulse-oscillated laser light) to a semiconductor film obtained by crystallizing an amorphous silicon film by the heat treatment. It has been confirmed that this measure reduces the number of holes generated by the FPM treatment. The reason for this phenomenon would be that the irradiation with laser light produces a kind of non-equilibrium state in which the catalyst element diffuses more easily.

It is also effective to apply a laser light or a strong light equivalent thereto before the heat treatment for gettering. The reason for this phenomenon would be that the group-13 element and the group-15 element have been activated before the heat treatment.

Figure 1A:
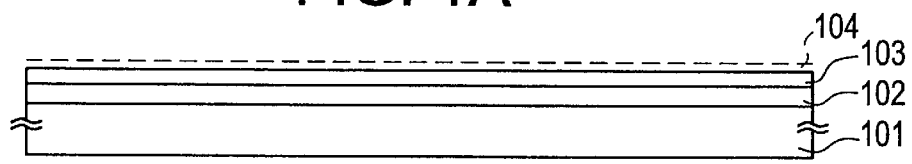
FIGS. 1A–1F are sectional views of a substrate showing a gettering process according to a first embodiment of the present invention.

A general embodiment of the invention will be described below with reference to FIGS. 1A–1F. First, as shown in FIG. 1A, an amorphous semiconductor film 103 comprising silicon is formed on a substrate 101, a layer 104 comprising a catalyst element for accelerating crystallization is formed on the amorphous semiconductor film 103, and then the catalyst element is introduced into the amorphous semiconductor film 103.

Figure 1B:
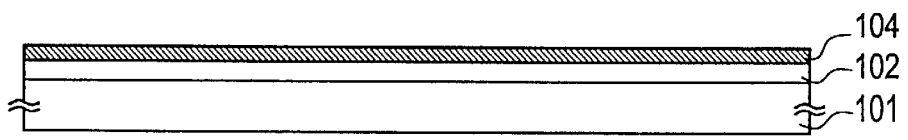
Figure 1C:
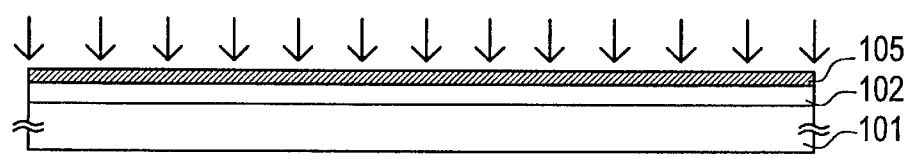

Then, as shown in FIG. 1B, the amorphous semiconductor film 103 is crystallized by a heat treatment into a crystalline semiconductor film 105. Then, as shown in FIG. 1C, the crystallinity is improved by irradiating with laser light, whereby a crystalline semiconductor film 106 is obtained.

Figure 1D:
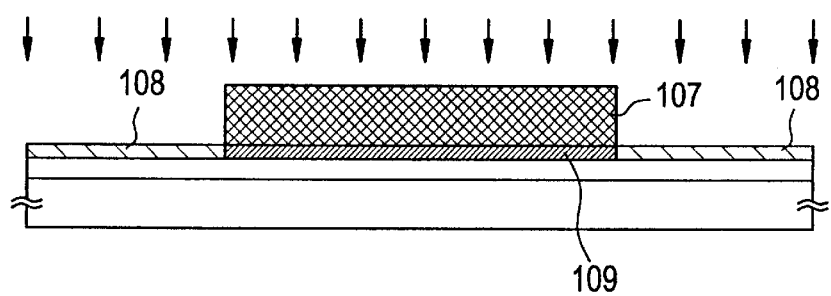

Thereafter, as shown in FIG. 1D, a group-13 impurity element and a group-15 impurity element are selectively introduced into the crystallized semiconductor film 106, to form a gettering region 108. This may be done by a vapor-phase method such as ion doping or plasma doping, a solid-phase method using a layer comprising the group-13 element and/or the group-15 element, or a liquid-phase method using a solution.

Figure 1E:
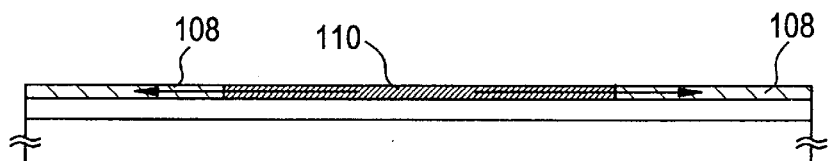
Figure 1F:
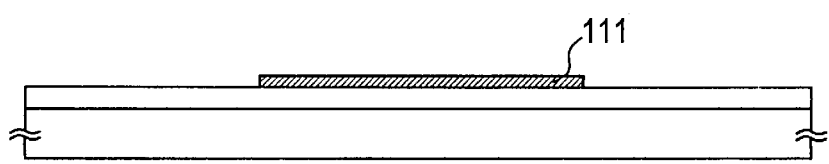

Then, as shown in FIG. 1E, a heat treatment is performed whereby the catalyst element in a region 109 of the crystallized semiconductor film 106 in which no impurity element has been introduced is moved (gettered) to the gettering region 108 and gettered there. A crystalline semiconductor film 110 is thus obtained in which the catalyst element concentration is lowered. As shown in FIG. 1F, the film 110 is patterned into a semiconductor layer 111 of a semiconductor device. Before the heat treatment, the impurities in the gettering region 108 may be activated by irradiation with laser light such as excimer laser light.

Specific embodiments of the invention will be hereinafter described with reference to FIGS. 1A–1F to 9A–9F.

Embodiment 1

Figure 2A:
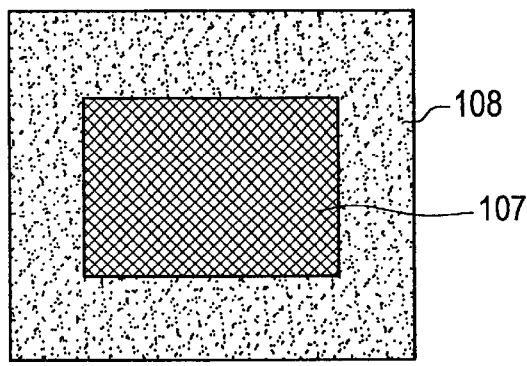
FIGS. 2A–2C are plan views of the substrate showing the gettering process according to the first embodiment.
Figure 2B:
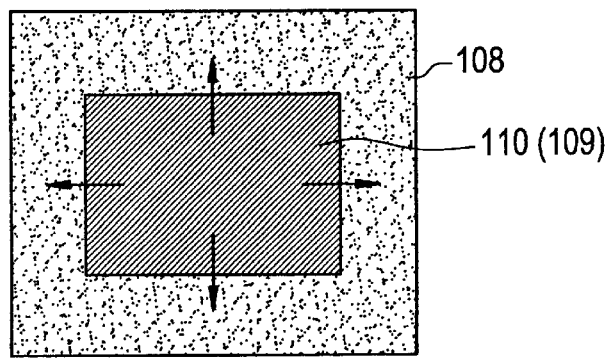
Figure 2C:
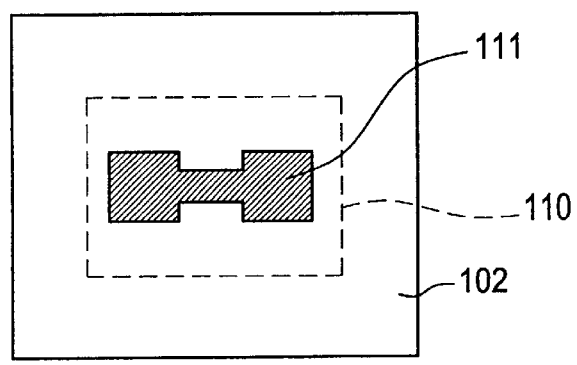

This embodiment will be described with reference to FIGS. 1A–1F to 3A–3E. This embodiment is directed to a method in which a crystalline silicon film (polysilicon film) is formed through crystallization using nickel as a catalyst element and nickel in the crystalline silicon film is gettered by utilizing P (phosphorus) and B (boron). FIGS. 1A–1F are sectional views of a substrate and FIGS. 2A–2C are plan views corresponding to FIGS. 1D–1F, respectively.

First, as shown in FIG. 1A, a 200-nm-thick silicon oxide film as an undercoat film 102 is formed on a glass substrate 101 by plasma CVD. Thereafter, an amorphous silicon film 103 is formed by low-pressure CVD or plasma CVD at a thickness of 10–70 nm, preferably 15–45 nm. In this embodiment, a 55-nm-thick amorphous silicon film 103 is formed by low-pressure CVD. Other than the amorphous silicon film 103, an amorphous semiconductor film comprising silicon, such as $Si_xGe_{1-x}(0<X<1)$, may be used.

Then, the amorphous silicon film 103 is crystallized in the following manner. First, a very thin oxide film (not shown) is formed on the surface of the amorphous silicon film 103 by irradiating with UV light in an oxygen atmosphere. This oxide film has a function of improving the wettability of a solution containing nickel that will be applied later.

Thereafter, a solution comprising nickel is applied to the surface of the amorphous silicon film 103. The nickel content (in terms of weight) may be 0.1–50 ppm, preferably 1–30 ppm. This is to make the nickel concentration of the amorphous silicon film 103 of the order of $10^{15}$ to $10^{19}$ atoms/cm$^3$. If the nickel concentration is lower than $10^{15}$ atoms/cm$^3$, the catalyst action of nickel is not obtained. If it is on the order of $10^{19}$ atoms/cm$^3$, a TFT capable of proper operation can be manufactured even without gettering nickel and, when a gettering step is executed, it can be executed efficiently. The above nickel concentration values are ones defined by the maximum value of SIMS measurement values.

In this embodiment, a nickel acetate salt solution comprising nickel at 10 ppm is applied. An excessive part of the nickel acetate salt solution is removed, that is, blown out, by rotating the substrate 101 with a spin coater, whereby a very thin nickel-containing layer 104 is formed on the surface of the amorphous silicon film 103.

After the state of FIG. 1A has been obtained, the amorphous silicon film 103 is crystallized by performing a heat treatment at 550° C. for 4 hours in a nitrogen atmosphere. A crystalline silicon film 105 is obtained by this crystallization step (see FIG. 1B). Since the crystal growth proceeds from the surface of the amorphous silicon film 103 where nickel is added toward the undercoat film 102 (i.e., vertically), it is called vertical growth in this specification.

While a polysilicon film having grain boundaries is formed by the above crystallization step, a microcrystalline silicon film can also be formed under different conditions.

The above heat treatment may be performed at 500°–700° C., preferably 550°–650° C., in an electric furnace. In view of the heat resistance of the glass substrate 101 used, the upper limit of the heating temperature should be lower than the glass strain point of the glass substrate 101. If the heating temperature were higher than the glass strain point, the glass substrate 101 would warp, contract, and so forth. The heating time may be set at about 1–12 hours. This heating treatment is carried our by furnace annealing (in an electric furnace). Alternatively, laser annealing, lamp annealing, or the like may be used.

Then, laser light is applied to the resulting crystalline silicon film 105, whereby a crystallinity-improved crystalline silicon film 106 is obtained (see FIG. 1C). In this embodiment, a pulse-oscillation-type KrF excimer laser (wavelength: 248 nm) is used.

Other pulse-oscillation-type lasers such as a shorter-wavelength (ultraviolet range) XeCl excimer laser and a longer-wavelength YAG laser may be used. Since the excimer laser light used in this embodiment emits ultraviolet light, instantaneous melting and solidification are repeated in the irradiated region. Therefore, the irradiation with excimer laser light causes a kind of non-equilibrium state in which nickel is very easy to move.

Amorphous components remain irregularly in the crystalline silicon film 105 that has been obtained by the crystallization step of FIG. 1B. However, since those amorphous components can be crystallized completely by irradiation with laser light, the crystallinity of the crystalline silicon film 106 is greatly improved.

Although the laser irradiation step can be omitted, it is noted that the laser irradiation has an effect of improving the efficiency of a later gettering step in addition to the effect of improving the crystallinity. After the laser irradiation, the maximum value of SIMS measurement values of the concentration of nickel remaining in the crystalline silicon film 106 is about $1\times10^{19}$ to $2\times10^{19}$ atoms/cm$^3$.

After the completion of the laser light irradiation, the oxide film on the surface of the crystalline silicon film 106 is removed and a thin oxide film (not shown) is formed again by irradiation with UV light in an oxygen atmosphere. A resist film 107 is formed on the oxide film. The oxide film has an effect of improving the adhesion of the resist film 107.

Then, the crystalline silicon film 106 is doped with a P (phosphorus) element and a B (boron) element by ion doping or ion implantation. Ion doping is used in this embodiment. Phosphine is used as a source gas and the acceleration voltage is set at 5–30 kV. The dose is so set that the concentration of doped P becomes $1.7\times10^{15}$ atoms/cm$^2$ or more.

As for the B doping conditions, diborane is used as a source gas and the acceleration voltage is set at 5–30 kV. The dose is so set that the concentration of doped B becomes $1.7\times10^{15}$ atoms/cm$^2$ or more, preferably $2.5\times10^{15}$ to $5\times10^{15}$ atoms/cm$^2$.

In this embodiment, P is doped first and then B is introduced. As for the P doping conditions, the acceleration voltage was set at 10 kV and the dose was so set as to provide a P concentration $1.7\times10^{15}$ atoms/cm$^2$. As for the B doping conditions, the acceleration voltage was set at 10 kV and the dose was so set as to provide a B concentration $2.5\times10^{15}$ atoms/cm$^2$.

As a result of the doping with P and B, a region 108 (hereinafter referred to as a gettering region 108) that is not covered with the resist film 107 comes to contain P and B at high concentrations. The region 108 is rendered amorphous by impact of doping ions. On the other hand, a region 109 (hereinafter referred to as a gettering subject region 109) is not doped with P or B and hence its crystallinity is maintained, because it is covered with the resist mask 107 (see FIGS. 1D and 2A).

The optimum conditions of the P and B doping step depend on the thickness of the crystalline silicon film 106 (or the initial thickness of the amorphous silicon film 103) and vary with the conditions of a heat treatment of a gettering step to be executed later. The doping conditions should be set further in consideration of the sizes of the gettering region 108 and the gettering subject region 109.

After the completion of the P and B doping step, the resist mask 107 is removed by using a dedicated remover. Subsequently, a heat treatment for gettering is performed whereby nickel remaining inside the gettering subject region 109 is moved to the gettering region 108. In this embodiment, a heat treatment is performed at 600° C. for 12 hours in a nitrogen atmosphere. A gettering subject region 110 having a reduced nickel concentration is thus obtained (see FIGS. 1E and 2B)).

In the above heat treatment step, nickel atoms remaining inside the gettering subject region 109 are moved to the gettering region 108 (in the directions indicated by arrows). It is considered that this movement of nickel is accelerated by the factors that nickel is rendered easier to move by the above-described laser irradiation and that the gettering region 108 is rendered amorphous.

Then, an island-like region 111 to become a semiconductor layer of a TFT is obtained by removing the gettering region 108 by patterning. Since the nickel concentration in the island-like region 111 is sufficiently lowered, the leak current can be reduced to a negligible level (see FIGS. 1F and 2C). A TFT may be completed by a well-known method including a gate insulating film forming step and the like.

There is a possibility that the nickel concentration is high in a peripheral portion of the gettering subject region 110 that is adjacent to the gettering region 108. Therefore, it is desirable to also remove the peripheral region at the time of patterning so that the peripheral region is not included in the island-like region 111.

Now, a process of manufacturing a CMOS circuit as a complementary combination of an n-channel TFT and a p-channel TFT by using the island-like region 111 that has been obtained by the process of FIGS. 1A–1F and 2A–2C will be described with reference to FIGS. 3A–3E.

Figure 3A:
FIGS. 3A–3E show a TFT manufacturing process according to the first embodiment.
Figure 3B:
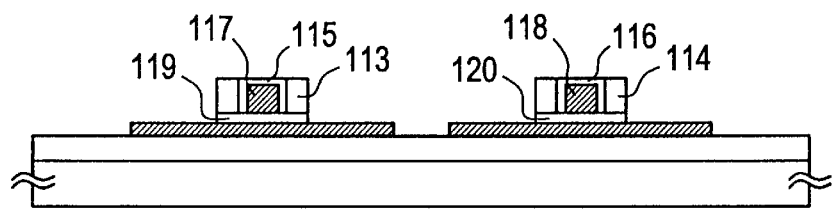
Figure 3C:
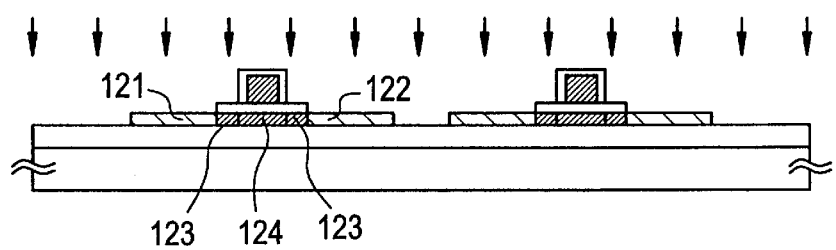
Figure 3D:
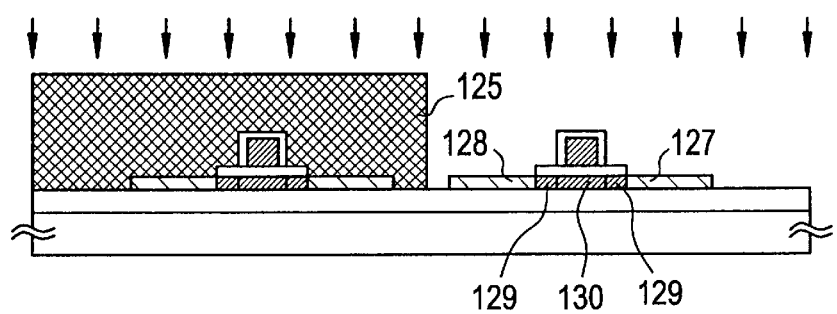

In FIG. 3A, reference symbols 111N and 111P are semiconductor layers for an n-channel TFT and a p-channel TFT, respectively. The semiconductor layers 111N and 111P correspond to the island-like region 111 shown in FIGS. 1F and 2C. A 150-mn-thick silicon oxide film 112 is formed on the semiconductor layers 111N and 111P by plasma CVD or low-pressure CVD (see FIG. 3A).

Thereafter, a metal film including aluminum as the main component is formed and then patterned into starting patterns of gate electrodes. Then, an anodization technique disclosed in Japanese Patent Application Laid-open No. Hei. 7-135318 is utilized in the following manner. First, porous anodic oxide films 113 and 114 are formed on the side faces of the gate electrode starting patterns by using the above technique. Then, dense anodic oxide films 115 and 116 are formed around the respective gate electrode starting patterns. The, non-anodized, residual parts of the gate electrode starting patterns are thus defined as gate electrodes 117 and 118.

Then, the silicon oxide film 112 is etched by using the gate electrodes 117 and 118 and the porous anodic oxide films 113 and 114 as masks, to form gate insulating films 119 and 120. Subsequently, the porous anodic oxide films 113 and 114 are removed. As a result, parts of the gate insulating films 119 and 120 are exposed from the ends of the gate electrodes 117 and 118 (see FIG. 3B).

Then, impurity ions to impart n-type conductivity are added in two steps by ion plantation or ion doping. In this embodiment, P ions are added by ion doping. First impurity addition is performed at a high acceleration voltage, to form n⁻ regions.

At this time, because of the high acceleration voltage, impurity ions are added to not only the active layers 111N and 111P but also the regions under the exposed end portions of the gate insulating films 119 and 120. The dose is so set that the n⁻ regions will serve as LDD regions (impurity concentration: about $1 \times 10^{18}$ to $1 \times 10^{19}$ atoms/cm³) Second impurity addition is then performed at a low acceleration voltage, to form n⁺ regions. At this time, because of the low acceleration voltage, the gate insulating films 119 and 120 serve as masks. Since the n⁺ regions will become source and drain regions, the dose is so set to provide a sheet resistance of 500 Ω or less (preferably 300 Ω or less).

As a result of the execution of the above step, a source region 121, a drain region 122, low-concentration impurity regions 123, and a channel forming region 124 of an n-channel TFT are formed. In this state, the active layer 111P of a p-channel TFT is in the same state as the active layer 111N of the n-channel TFT (see FIG. 3C).

Then, after a resist mask 125 is formed so as to cover the n-channel TFT, an impurity for imparting p-type conductivity is added by ion implantation or ion doping. In this embodiment, B is added by ion doping. This step is executed in two steps as in the case of the step of adding the impurity for imparting n-type conductivity. As a result, a source region 127, a drain region 128, low-concentration impurity regions 129, and a channel forming region 130 of the p-channel TFT are formed (see FIG. 3D).

However, in this step, it is necessary to reverse the conductivity from the n type to the p type. Therefore, impurity ions need to be added by an amount 2–3 times larger than that in the above step for the n-channel TFT.

After the completion of the above doping step, furnace annealing, laser annealing, or lamp annealing is performed to activate the impurity ions and repair damage that was caused by the ion addition.

Then, a 500-nm-thick interlayer insulating film 131 is formed which may be a silicon oxide film, a silicon nitride film, a silicon oxynitride film, or an organic resin film, or a laminated film thereof.

Figure 3E:
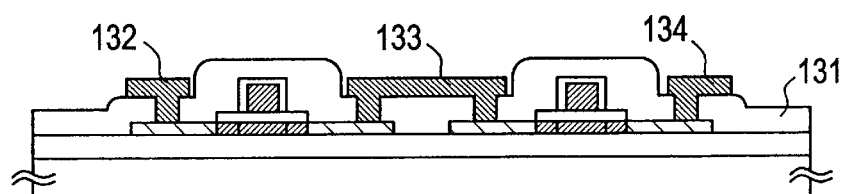

After contact holes are formed, source lines 132 and 134 and a drain line 133 are formed to obtain a state shown in FIG. 3E. The entire structure is then hydrogenated by performing a heat treatment in a hydrogen atmosphere, to complete a CMOS circuit.

The CMOS circuit of this embodiment is also called an inverter circuit which is a basic circuit in constructing a semiconductor circuit. By combining such inverter circuits and other circuits, basic logic circuits such as a NAND circuit and a NOR circuit and even more complex circuits can be constructed.

Embodiment 2

While the first embodiment is directed to the case where an amorphous silicon film is crystallized by vertical growth, the second embodiment is directed to a case where an amorphous silicon film is crystallized by a different method. The catalyst element of nickel is also used in this embodiment. This embodiment will be described below with reference to FIGS. 4A–4F.

Figure 4A:
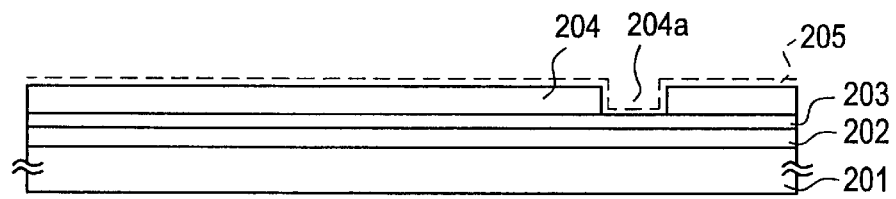
FIGS. 4A–4F are sectional views of a substrate showing a gettering process according to a second embodiment of the invention.

First, as shown in FIG. 4A, a 200-nm-thick undercoat film 202 and a 50-nm-thick amorphous silicon film 203 are formed on a glass substrate 201. A 70-nm-thick silicon oxide film as a mask insulating film 204 is formed on the amorphous silicon film 203, and then an opening 204a for selective addition of a catalyst element (nickel as in the first embodiment) is formed through the mask insulating film 204.

In this state, a very thin oxide film (not shown) for improving the wettability is formed on the surface of the exposed portion of the amorphous silicon film 203 by irradiating it with UV light in an oxygen atmosphere. Subsequently, a very thin nickel-containing layer 205 is formed on the surface of the amorphous silicon film 203 by applying a nickel acetate salt solution containing nickel at 10 ppm (in terms of weight) by spin coating (see FIG. 4A).

After the state of FIG. 4A has been obtained, the amorphous silicon film 203 is crystallized by performing a heat treatment at 600° C. for 8 hours in a nitrogen atmosphere. The crystallization of the amorphous silicon film 203 proceeds in the arrow-indicated direction that is parallel with the film surface (i.e., laterally) from a region 206 where nickel is added (see FIG. 4B). In this specification, this type of crystal growth is called lateral growth.

As a result of this crystallization step, a polysilicon film is formed that is a collected body of needle-like or columnar crystals. The inventors call a region that has been crystallized in this manner a lateral growth region.

After the crystallization, the film consists of three regions: the nickel-added region 206 (crystalline silicon film), a lateral growth region 207 (crystalline silicon film), and a region 208 (amorphous silicon film) that the lateral growth did not reached. Since only the lateral growth region 207 will be needed finally, the other regions will not be described.

Figure 4B:
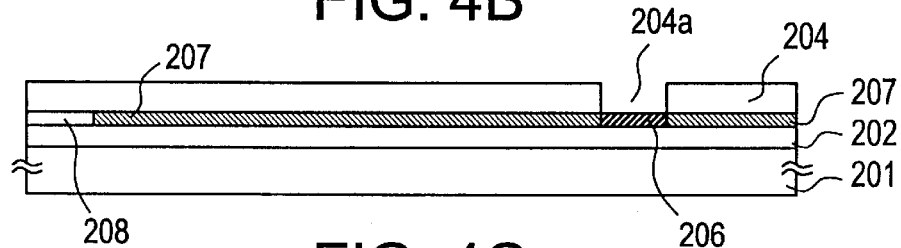
Figure 4C:
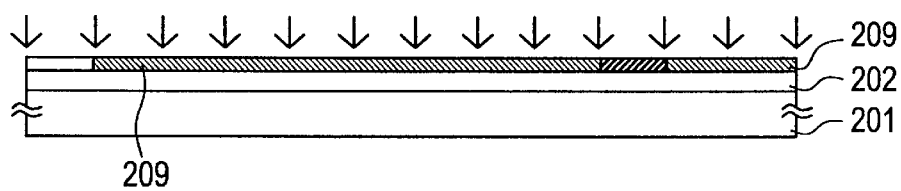
Figure 4D:
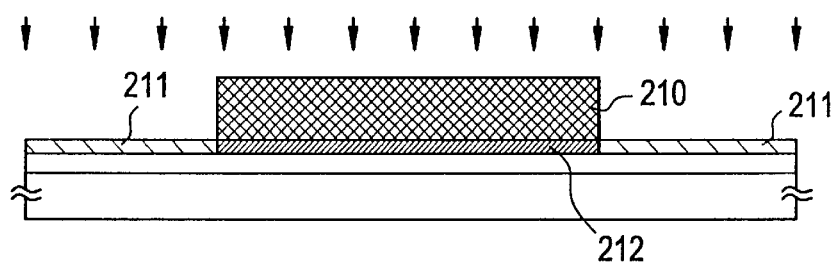
Figure 4E:
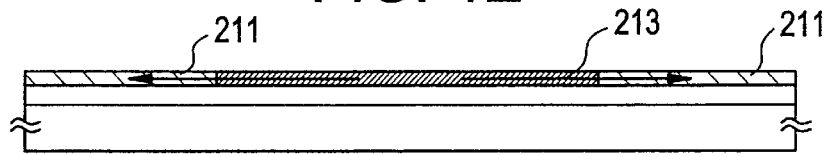

Then, laser light is applied to the crystallized silicon film, whereby the lateral growth region 207 becomes a crystalline silicon film 209 that has been improved greatly in crystallinity (see FIG. 4C). In this embodiment, a KrF excimer laser is used for this purpose. This laser irradiation step serves to not only improve the crystallinity but also establish a state that nickel is easy to getter.

After the completion of the laser light irradiation, a resist mask 210 is formed and a P and B doping step is executed in the following manner. The doping conditions may be set properly by a researcher who practice the invention according to the description of the first embodiment. It is preferable to determine the doping conditions in consideration of the conditions of a heat treatment of a later gettering step.

In this embodiment, P is doped first and then B is introduced. As for the P doping conditions, the acceleration voltage was set at 10 kV and the dose was so set as to provide a P concentration $1.7 \times 10^{19}$ atoms/cm$^2$. As for the B doping conditions, the acceleration voltage was set at 10 kV and the dose was so set as to provide a B concentration $2.5 \times 10^{19}$ atoms/cm$^2$. As a result of this doping step, a gettering region 211 and a gettering subject region 212 are defined (see FIG. 4D).

After the completion of the doping step, the resist mask 210 is removed by a dedicated remover. Subsequently, a heat treatment is performed at 600° C. for 12 hours, whereby nickel remaining inside the gettering subject region 212 is moved to the gettering region 211 (in the directions indicated by arrows). In this manner, a gettering subject region 213 having a reduced nickel concentration is obtained (see FIG. 4E).

Then, an island-like region 214 in which the nickel concentration has been lowered sufficiently is obtained by removing the gettering region 211 by patterning. A TFT may be completed by a known method including a gate insulating film forming step by using the island-like region 214 as the semiconductor layer of the TFT.

Figure 4F:
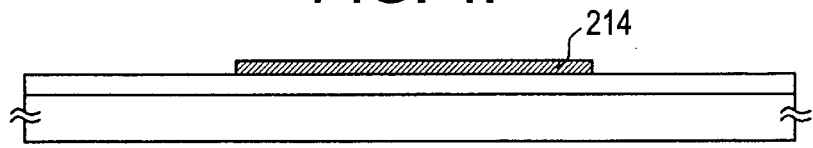

It is preferable that the patterning step of FIG. 4F be so executed that a peripheral portion of the gettering subject region 212 adjacent to the gettering region 211 is not included in the island-like region 214.

The lateral growth region 207 that is obtained by the crystallization step of FIG. 4B has a feature that the nickel concentration is lower than that of the vertical growth region 105, 109 (see FIGS. 1C and 1D) of the first embodiment. Therefore, the use of the lateral growth process provides an advantage that process-related margins are increased: the gettering process temperature can be reduced, the gettering process time can be shortened, and so forth.

Embodiment 3

In the first and second embodiments, to increasing patterning margins, the gettering subject region is so formed as to be wider than the semiconductor layer of the actual TFT. This causes a possibility that the integration density of semiconductor layers constituting elements such as TFTs becomes low. The third embodiment is directed to a method for solving this problem.

In this embodiment, to increase the integration density of semiconductor layers, at least a channel forming region is formed by using only a gettering subject region and source and drain regions include a gettering region (doped with P and B). This embodiment will be described below with reference to FIGS. 5A–5D and 6A–6E.

First, a 200-nm-thick silicon oxide film as an undercoat film 302 is formed on a glass substrate 301. A 55-nm-thick amorphous silicon film is formed on the undercoat film 302. Thereafter, the amorphous silicon film is crystallized by the vertical growth method of the first embodiment or the lateral growth method of the second embodiment, and then the crystallinity is improved by irradiating with excimer laser light. As a result, a crystalline silicon film 303 is formed on the undercoat film 302 (see FIG. 5A).

Figure 5A:
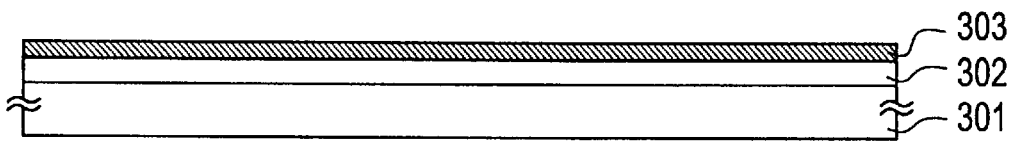
FIGS. 5A–5D are sectional views of a substrate showing a gettering process according to a third embodiment of the invention.
Figure 5B:
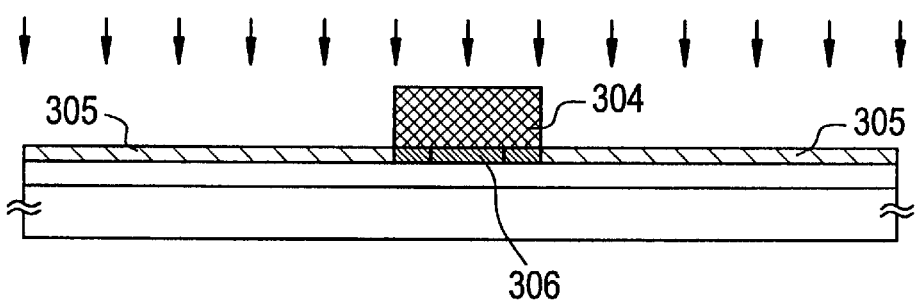
Figure 5C:
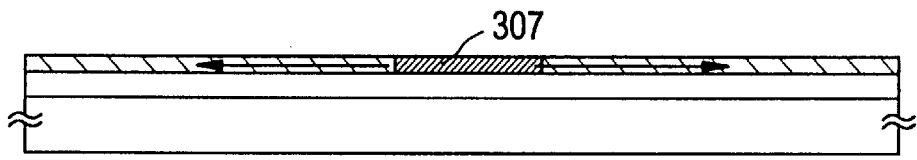
Figure 5D:
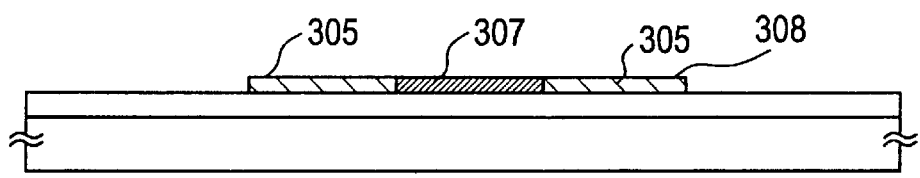
Figure 6A:
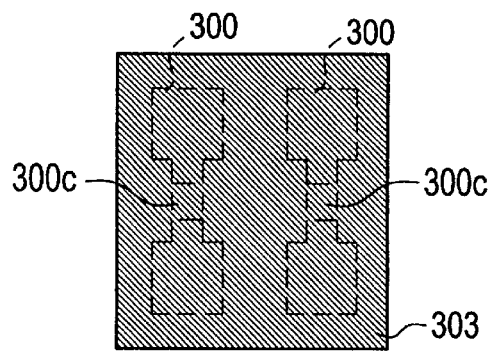
FIGS. 6A–6E are plan views of the substrate showing the gettering process according to the third embodiment.
Figure 6D:
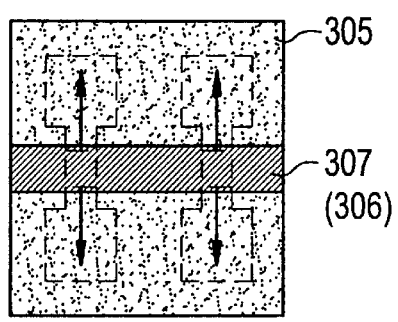

FIG. 6A is a plan view corresponding to FIG. 5A. Patterns 300 shown by broken lines on the crystalline silicon film 303 are regions to become semiconductor layers of TFTs. Regions 300c in the respective patterns 300 are regions to become channel forming regions and have a size of 8 μm×8 μm.

Figure 6B:
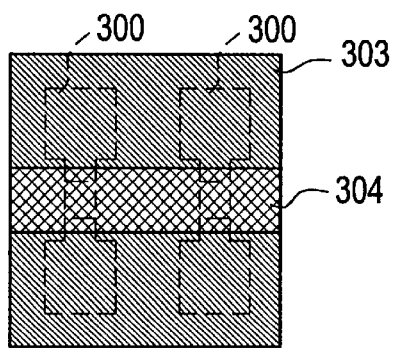
Figure 6E:
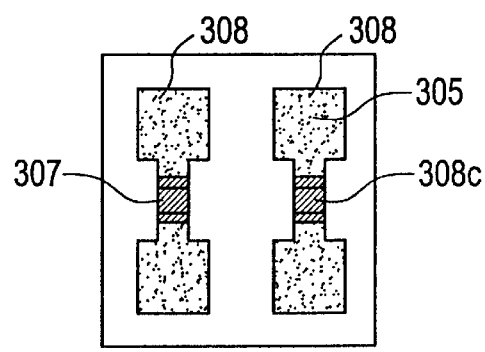
Figure 6C:
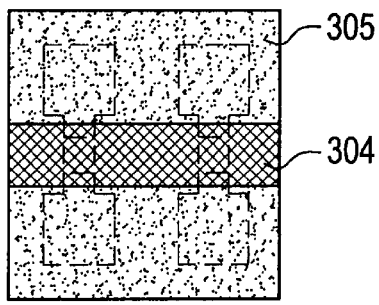

Then, as shown in FIG. 6B, a resist mask 304 is formed on the crystalline silicon film 303 so as to cover at least the regions 300c to become channel forming regions of semiconductor layers. If the end faces of the channel forming regions (in particular, the faces that are not joined to source and drain regions) included the interface between a gettering region and a gettering subject region, a resulting TFT would not operate properly. In view of this, in this embodiment, a band-like mask 304 of 10 μm in width is formed so that a margin of 1 μm is obtained with respect to the regions 300c.

Then, a P and B doping step is executed in the following manner. First, P is introduced under the conditions that the acceleration voltage is set at 10 kV and the dose is so set as to provide a P concentration $1.7 \times 10^{19}$ atoms/cm$^2$. Subsequently, B is introduced under the conditions that the acceleration voltage is set at 10 kV and the dose is so set as to provide a B concentration $2.5 \times 10^{15}$ atoms/cm. As a result of this doping step, a gettering region 305 and a gettering subject region 306 are defined (see FIGS. 5B and 6C).

After the completion of the doping step, the resist mask 304 is removed by a dedicated remover. Subsequently, a heat treatment is performed at 600° C. for 8 hours, whereby nickel remaining inside the gettering subject region 306 is moved to the gettering region 305 (in the directions indicated by arrows). In this manner, a gettering subject region 307 having a reduced nickel concentration is obtained (see FIGS. 5C and 6D).

Then, island-like regions 308 having the patterns 300 are obtained by patterning. Each island-like region 308 consists of gettering regions 305 and a gettering region 307 having a reduced nickel concentration (see FIGS. 5D and 6E). TFTs may be formed by, for instance, the process of the first embodiment (see FIGS. 3A–3E) by using the island-like regions 308 that have been obtained by the above steps.

Since the gettering regions 305 have p-type conductivity, p-type source and drain regions can be formed by using the gettering regions 305. Therefore, a doping step for imparting p-type conductivity can be omitted.

A channel forming region 308c of each island-like region 308 is part of the gettering subject region 307 that is substantially intrinsic and reduced in nickel concentration. Therefore, a sudden variation of the threshold voltage can be prevented. On the other hand, even if nickel and other impurities for imparting conductivity are contained in regions to become source and drain regions, they do not much impair the electrical characteristics of a TFT.

In this embodiment, the source and drain regions are offset from the channel forming region 308c by 1 µm. The offset length may be determined properly by the shape of the resist mask 304. For example, the width of the resist mask 304 may be increased so that the gettering regions 305 constitute only parts of the source and drain regions.

While in the first and second embodiments all the gettering region 305 and part of the gettering subject region 306 are removed in forming the island-like region by patterning, in this embodiment the gettering regions 305 are left as parts of each island-like region 308. Therefore, the area of the regions removed by the patterning is reduced, which makes it possible to form the island-like regions 308 in a more integrated manner. Further, since the nickel diffusion lenght is shortened, the areas of the gettering regions are relatively increased, which in turn shortens the time of the heat treatment for gettering.

Further, since the resist mask 304 is made small, the contamination of a chamber for the doping can be reduced, which saves the time and labor for cleaning, thereby increasing the throughput.

Embodiment 4

For a gettering region doped with P and B to exhibit a gettering action, the B concentration should be higher than the P concentration. Therefore, the gettering region has n-type conductivity. Further, as shown in FIGS. 13A–13E, an n-type region doped with only P can function as a gettering region.

In view of the above, in this embodiment, CMOS TFTs are manufactured by using n-type and p-type gettering regions as source and drain regions of the TFTs. A manufacturing process according to this embodiment will be described below with reference to FIGS. 7A–7G.

First, a 200-nm-thick silicon oxide film as an undercoat film 402 is formed on a glass substrate 401. A 55-nm-thick amorphous silicon film is formed on the undercoat film 402. Thereafter, the amorphous silicon film is crystallized by the vertical growth method of the first embodiment or the lateral growth method of the second embodiment, and then the crystallinity is improved by irradiating it with excimer laser light. As a result, a crystalline silicon film 403 is formed on the undercoat film 402 (see FIG. 7A)

Then, the crystalline silicon film 403 is patterned into an island-like region 404N to become a semiconductor layer of an n-channel TFT and an island-like region 404P to become a semiconductor layer of a p-channel TFT. A 150-nm-thick silicon oxide film 405 is formed on the island-like regions 404N and 404P by plasma CVD or low-pressure CVD.

Figure 7A:
FIGS. 7A–7G show a TFT manufacturing process according to a fourth embodiment of the invention.
Figure 7B:
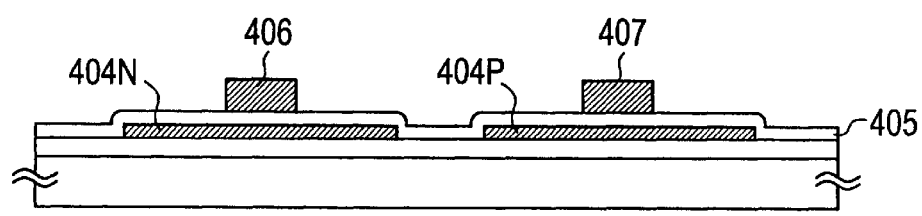

Thereafter, a conductive film is formed and then patterned into gate electrodes 406 and 407 (see FIG. 7B). It is preferable that the conductive film be made of a material that can withstand the temperature (about 550°–650° C.) of a heat treatment for gettering that will be performed later. Examples of such a material are refractory metals such as Ta (tantalum), Mo (molybdenum), Ti (titanium), W (tungsten), and Cr (chromium), suicides that are compounds of silicon and any of those metals, and polysilicon having n-type or p-type conductivity. Chromium is used in this embodiment.

Figure 7C:
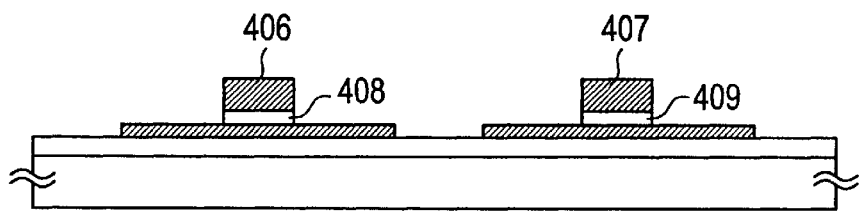
Figure 7D:
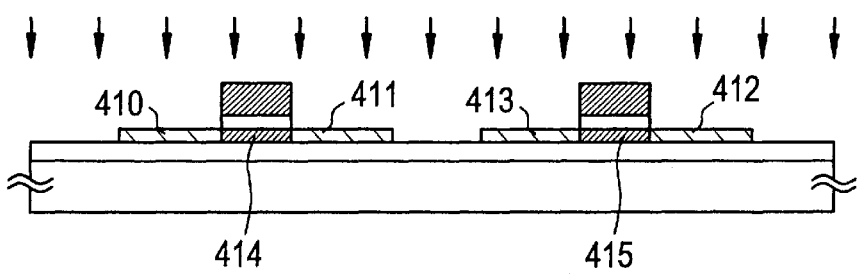
Figure 7E:
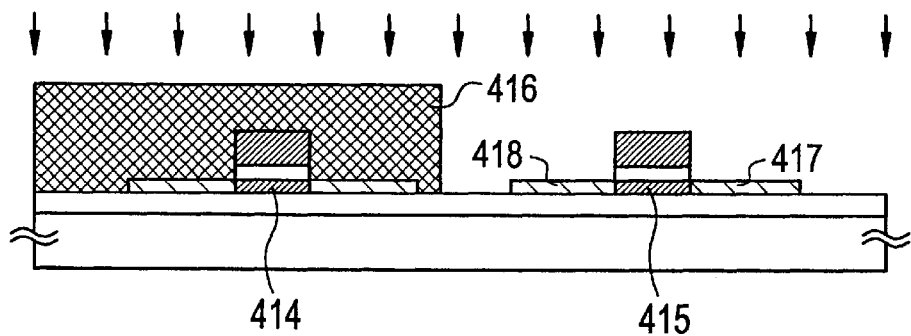
Figure 7F:
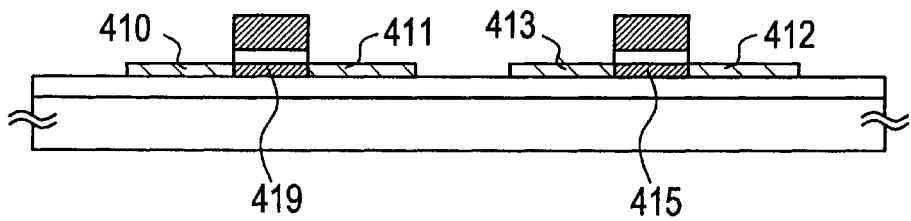

Then, the silicon oxide film 405 is patterned into gate insulating films 408 and 409 by using the gate electrodes 406 and 407 as masks (see FIG. 7C). The reason why the silicon oxide film 405 is patterned is to prevent the silicon oxide film 405 from acting as a mask in the ensuing doping step using a relatively low acceleration voltage (10–30 kV). If the silicon oxide film 405 acted as a mask, an impurity would not be added sufficiently to the island-like regions 404N and 404P.

Then, impurity ions for imparting n-type conductivity are added by ion implantation or ion doping. In this embodiment, P is added by ion doping. As for the doping conditions, the acceleration voltage is set at 10 kV and the dose is so set as to provide a P concentration $1.7 \times 10^{15}$ atoms/cm$^2$.

Since the gate electrodes 406 and 407 serve as masks, n-type impurity regions 410–413 and substantially intrinsic regions 414 and 415 are formed in the island-like regions 404N and 404P. In the island-like region 404N, the n-type impurity regions 410 and 411 will function as gettering regions for the intrinsic region 414 as well as source and drain regions of an n-channel TFT. The intrinsic region 414 will function as a channel forming region (see FIG. 7D).

Then, after a resist mask 416 is formed so as to cover the island-like region 404N, impurity ions for imparting p-type conductivity are added. In this embodiment, B is added. As for the doping conditions, the acceleration voltage is set at 10 kV and the dose is so set as to provide a B concentration $2.5 \times 10^{15}$ atoms/cm$^2$.

As a result, the conductivity type of the n-type impurity regions 412 and 413 is reversed and p-type impurity regions 417 and 418 are formed. On the other hand, the region 415 is kept substantially intrinsic. The p-type impurity regions 417 and 418 will function as gettering regions for the intrinsic region 415 as well as source and drain regions of a p-channel TFT. The intrinsic region 415 will become a channel forming region of the p-channel TFT (see FIG. 7E).

Then, after the resist mask 416 is removed with a dedicated remover, a heat treatment is performed at 600° C. for 12 hours. As a result, nickel in the intrinsic region 414 is moved to the n-type impurity regions 410 and 411 and gettered there, and nickel in the intrinsic region 415 is moved to the p-type impurity regions 417 and 418 and gettered there. As a result, channel forming regions 419 and 420 are formed where the nickel concentration has been reduced (see FIG. 7F). Further, this heat treatment for gettering activates the impurities added to the impurity regions 410, 411, 417, and 418.

Then, a 500-nm-thick interlayer insulating film 421 is formed which may be a silicon oxide film, a silicon nitride film, a silicon oxynitride film, or an organic resin film, or a laminated film thereof.

Figure 7G:
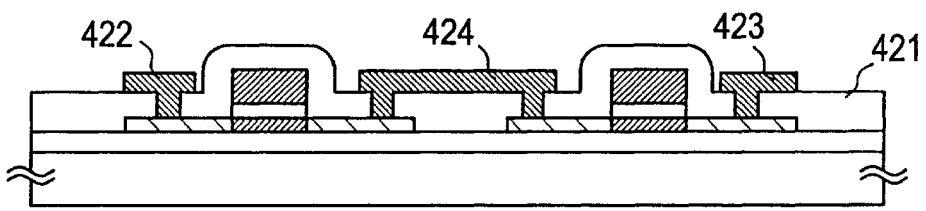

After contact holes are formed, source lines 422 and 423 and a drain line 424 are formed to obtain a state shown in FIG. 7G. The entire structure is then hydrogenated by performing a heat treatment in a hydrogen atmosphere, to complete a CMOS circuit.

In this embodiment, the doping step for forming gettering regions and the doping step for forming source and drain regions are combined into a single step and hence the throughput can be increased.

Embodiment 5

Like the fourth embodiment, this embodiment is intended to combine the doping step for forming gettering regions and the doping step for forming source and drain regions into a single step. This embodiment is directed to a manufacturing process of TFTs having an offset structure.

Figure 8A:
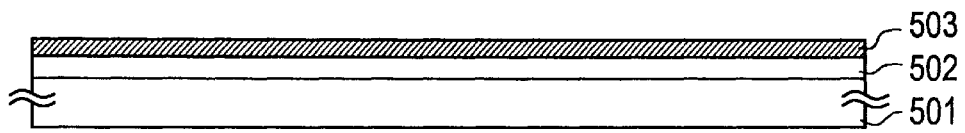
FIGS. 8A–8G show a TFT manufacturing process according to a fifth embodiment of the invention.

First, a 200-nm-thick silicon oxide film as an undercoat film 502 is formed on a glass substrate 501. A 55-nm-thick amorphous silicon film is formed on the undercoat film 502. Thereafter, the amorphous silicon film is crystallized by the vertical growth method of the first embodiment or the lateral growth method of the second embodiment, and then the crystallinity is improved by irradiating it with excimer laser light. As a result, a crystalline silicon film 503 is formed on the undercoat film 502 (see FIG. 8A) Then, the crystalline silicon film 503 is patterned into an island-like region 504N to become a semiconductor layer of an n-channel TFT and an island-like region 504P to become an active layer of a p-channel TFT. A 150-nm-thick silicon oxide film 505 is formed on the island-like regions 504N and 504P by plasma CVD or low-pressure CVD.

Figure 8B:
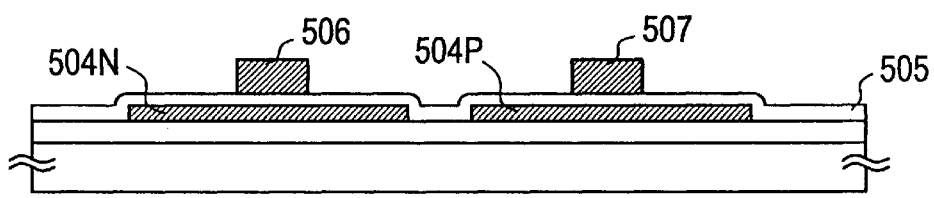

Thereafter, a conductive film is formed and then patterned into gate electrodes 506 and 507 (see FIG. 8B). It is preferable that the conductive film be made of a material that can withstand the temperature (about 550°–650° C.) of a heat treatment for gettering that will be performed later. Examples of such a material are refractory metals such as Ta (tantalum), Mo (molybdenum), Ti (titanium), W (tungsten), and Cr (chromium), silicides that are compounds of silicon and any of those metals, and polysilicon having n-type or p-type conductivity. Chromium is used in this embodiment.

Figure 8C:
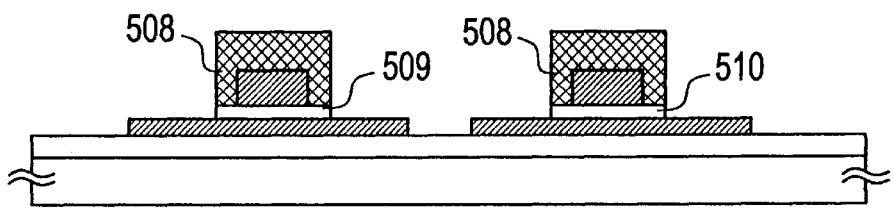

Then, after resist masks 508 are formed, the silicon oxide film 505 is patterned into gate insulating films 509 and 510 by using the resist masks 508. The reason why the silicon oxide film 505 is patterned is to prevent the silicon oxide film 505 from acting as a mask in the ensuing doping step using a relatively low acceleration voltage (10–30 kV). If the silicon oxide film 505 acted as a mask, an impurity would not be added sufficiently to the island-like regions 504N and 504P. Further, to form offset regions by utilizing the masking function of the silicon oxide films, the gate insulating films 508 and 509 are so formed as to project from the end faces of the gate electrodes 506 and 507 by about 1 μm (see FIG. 8C).

Then, P ions for imparting n-type conductivity are added by ion doping. As for the doping conditions, the acceleration voltage is set at 10 kV and the dose is so set as to provide a P concentration $1.7 \times 10^{15}$ atoms/cm$^2$.

Since the gate electrodes 506 and 507 and the gate insulating films 509 and 510 serve as masks, n-type impurity regions 511–514 and substantially intrinsic regions 515 and 516 are formed in the island-like regions 504N and 504P.

Figure 8D:
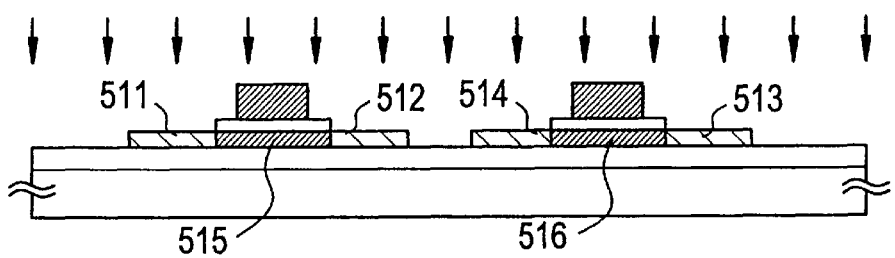

The n-type impurity regions 511 and 512 will function as gettering regions for the intrinsic region 515 as well as source and drain regions of an n-channel TFT. The intrinsic region 515 will constitute a channel forming region and offset regions (see FIG. 8D).

Then, after a resist mask 517 is formed so as to cover the island-like region 504N, impurity ions for imparting p-type conductivity are added. In this embodiment, B is added by ion doping. As for the doping conditions, the acceleration voltage is set at 10 kV and the dose is so set as to provide a B concentration $2.5 \times 10^{15}$ atoms/cm$^2$.

Figure 8E:
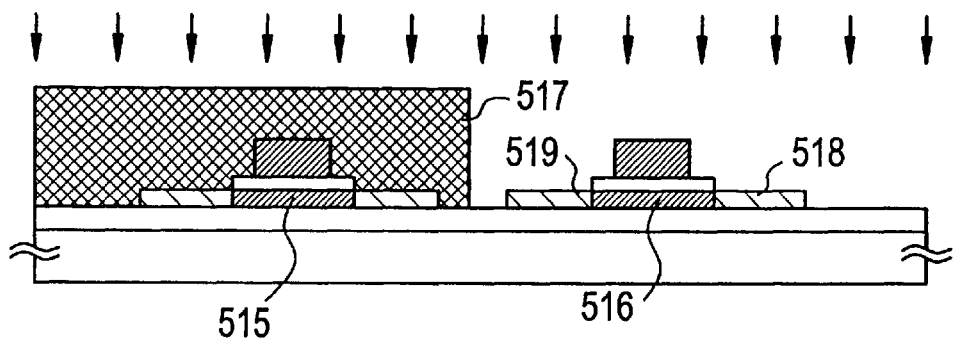

As a result, the conductivity type of the n-type impurity regions 513 and 514 is reversed and p-type impurity regions 518 and 519 are formed. On the other hand, the region 516 is kept substantially intrinsic. The p-type impurity regions 518 and 519 will function as gettering regions for the intrinsic region 516 as well as source and drain regions of a p-channel TFT. The intrinsic region 516 will become a channel forming region and offset regions of the p-channel TFT (see FIG. 8E).

Then, after the resist mask 517 is removed with a dedicated remover, a heat treatment is performed at 600° C. for 12 hours. As a result, nickel in the intrinsic region 515 is gettered to the n-type impurity regions 511 and 512, and nickel in the intrinsic region 516 is gettered to the p-type impurity regions 518 and 519.

Figure 8F:
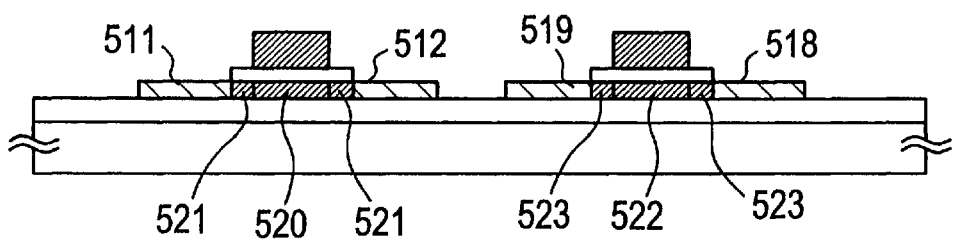

As a result, in the island-like region 504N, a channel forming region 520 and offset regions 521 are formed where the nickel concentration has been reduced. In the island-like region 504P, a channel forming region 522 and offset regions 523 are formed where the nickel concentration has been reduced. (see FIG. 8F). Further, this heat treatment for gettering activates the impurities added to the impurity regions 511, 512, 518, and 519.

Then, a 500-nm-thick interlayer insulating film 524 is formed which may be a silicon oxide film, a silicon nitride film, a silicon oxynitride film, or an organic resin film, or a laminated film thereof.

Figure 8G:
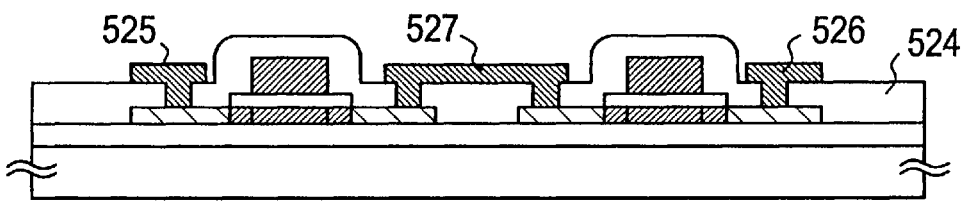

After contact holes are formed, source lines 525 and 526 and a drain line 527 are formed to obtain a state shown in FIG. 8G. The entire structure is then hydrogenated by performing a heat treatment in a hydrogen atmosphere, to complete a CMOS circuit.

In this embodiment, the doping step for forming gettering regions and the doping step for forming source and drain regions are combined into a single step and hence the throughput can be increased.

Although in the fourth and fifth embodiments the gate electrodes are formed before the gettering step, they may be formed after the gettering step. In this case, it is not necessary to restrict the gate electrode material to materials capable of withstand the temperature of the heat treatment for gettering. For example, aluminum may be used which has low resistivity though its melting point is low. In this case, it is necessary in the doping step to form masks that replace the gate electrodes by using a photoresist or the like.

Embodiment 6

While the above embodiments are directed to the case of manufacturing a top-gate TFT(s), the sixth embodiment is directed to a case of manufacturing an inverted stagger structure TFT that is a typical example of a bottom-gate TFT. This embodiment will be described with reference to FIGS. 9A–9F.

Figure 9A:
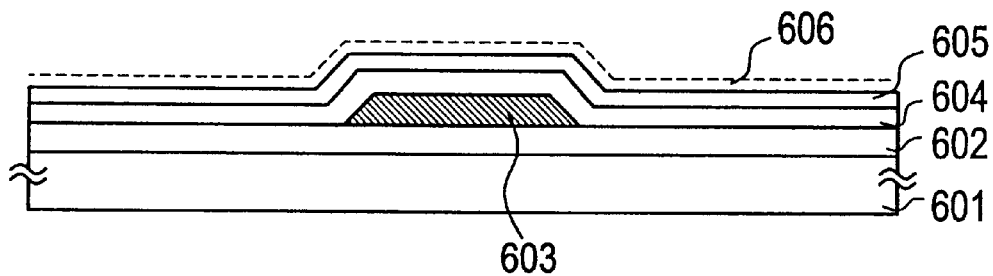
FIGS. 9A–9F show a TFT manufacturing process according to a sixth embodiment of the invention.

In FIG. 9A, reference numeral 601 denotes a glass substrate; 602, an undercoat film; 603, a gate electrode made of a conductive material; 604, a gate insulating film; 605, a 55-nm-thick amorphous silicon film; and 606, a nickel-containing layer formed in the same manner as in the first embodiment.

Since a gettering step will be performed later at 500°–650° C. by furnace annealing, the gate electrode 603 needs to be made of a material capable of withstand such a high temperature. Examples of such a material are refractory metals such as tantalum, molybdenum, chromium, and titanium, silicides of those refractory metals, polysilicon doped with an impurity, and microcrystalline silicon.

Figure 9B:
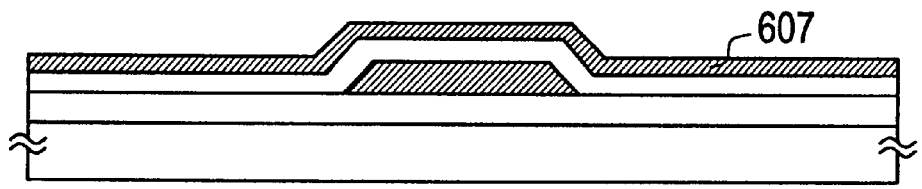

Then, a crystalline silicon film 607 is formed by performing a heat treatment at 550° C. for 4 hours and then irradiating a resulting film with excimer laser light (see FIG. 9B). Although the vertical growth method is used as the crystallization method, the lateral growth method of the second embodiment may be used.

Then, after a resist mask 608 is formed, elements P and B for gettering nickel are added. As for the P doping conditions, the acceleration voltage is set at 10 kV and the dose is so set as to provide a P concentration $1.7 \times 10^{15}$ atoms/cm. As for the B doping conditions, the acceleration voltage is set at 10 kV and the dose is so set as to provide a B concentration $2.5 \times 10^{15}$ atoms/cm$^2$. As a result of this step, a gettering region 609 and a gettering subject region 610 are defined (see FIG. 9C).

Then, a heat treatment is performed at 600° C. for 12 hours. Nickel inside the gettering subject region 610 diffuses into the gettering region 609, whereby a crystalline silicon film (gettering subject region) 611 is obtained in which the nickel concentration is reduced (see FIG. 9D).

Thereafter, the crystalline silicon film 611 obtained by the gettering step is patterned into a semiconductor layer 612. A channel stopper (also called an etching stopper) 613 is formed on the semiconductor layer 612 by patterning a silicon nitride film (see FIG. 9E).

Then, a source region 614 and a drain region 615 are formed by adding an impurity for imparting n-type or p-type conductivity by using the channel stopper 613 as a mask and then activating the impurity. Subsequently, a source line 616 and a drain line 617 are formed. Finally, the entire structure is hydrogenated to complete an inverted stagger structure TFT (see FIG. 9F).

Figure 9C:
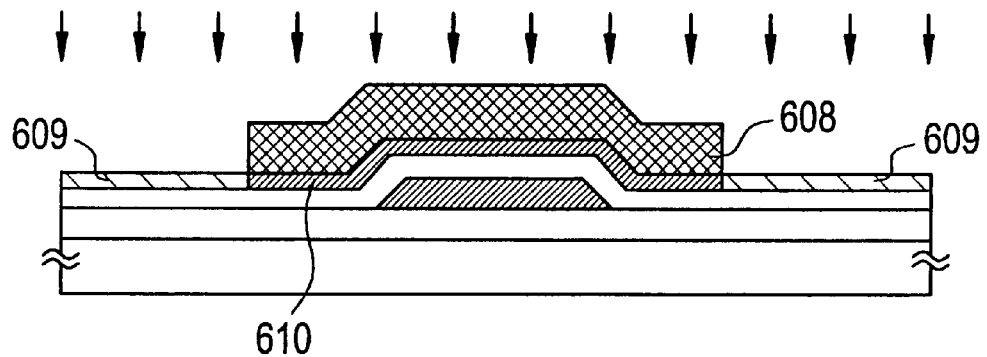
Figure 9D:
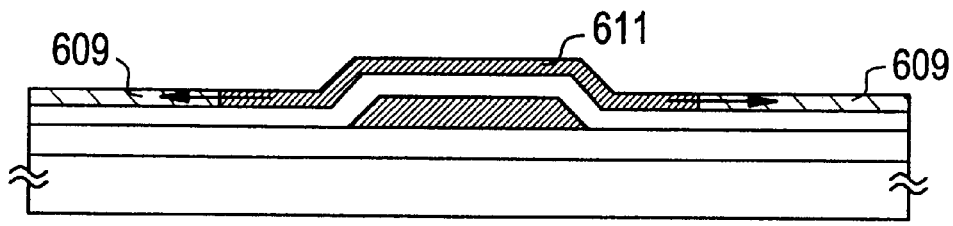
Figure 9E:
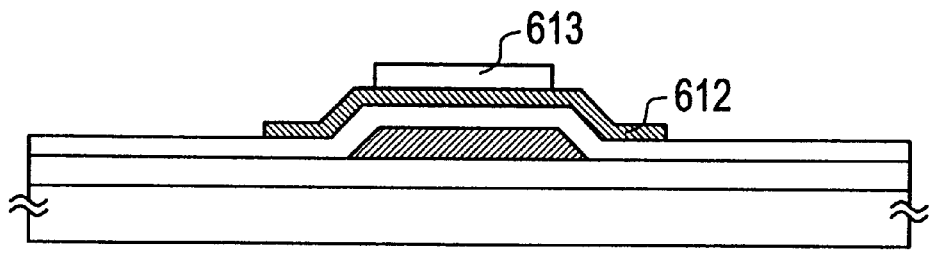
Figure 9F:
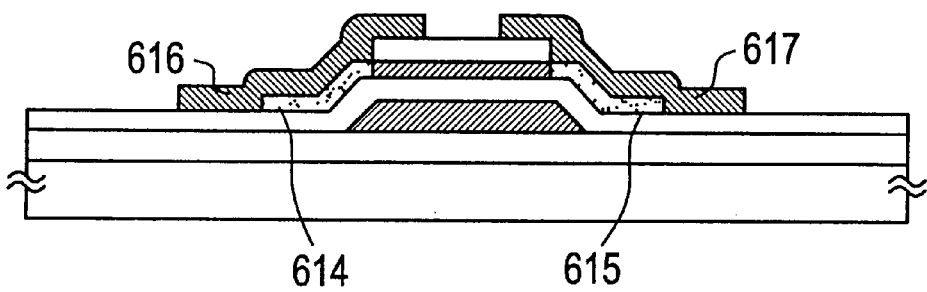

As described in the third embodiment, in the step of FIG. 9C, the resist mask 608 may be so formed as to cover at least the channel forming region. In this case, P is added when n-type source and drain regions are formed. In this manner, B and P doping for forming a gettering region and the doping for forming source and drain regions can be performed at the same time.

By utilizing the invention, a catalyst element can efficiently be removed from a crystalline semiconductor film that has been formed by using the catalyst element for accelerating crystallization, or its concentration can be reduced efficiently. Since the gettering process of the invention can be executed at a temperature lower than the highest heat-resistant temperature (strain point) of glass, conventional low-temperature processes can be used.

A crystalline semiconductor film obtained according to the invention has much superior crystallinity by virtue of the effect of the catalyst element, and the concentration of the catalyst element is reduced to a sufficiently low level by the gettering process. Therefore, when such a crystalline semiconductor film is used as the active layer of a semiconductor device, the semiconductor device is given superior electrical characteristics and high reliability. In particular, it becomes possible to prevent a sudden increase of an off-current of a TFT.

Further, by introducing, in addition to a group-15 element, a group-13 element to a gettering region, the invention makes it possible to getter a catalyst element remaining in a wider region by a gettering region having a smaller area than in the case of using a gettering region doped with only a group-15 element. Therefore, it becomes possible to form, in a more integrated manner, regions in which the catalyst element concentration has been reduced.

What is claimed is:

1. A method of manufacturing a semiconductor device comprising the steps of:
    forming a semiconductor film comprising amorphous silicon over a substrate;
    introducing a crystallization promoting material into the semiconductor film;
    crystallizing the semiconductor film;
    introducing a group-13 impurity element and a group-15 impurity element into a portion of the crystallized semiconductor film to form a gettering region;
    heating the crystallized semiconductor film so that the crystallization promoting material is moved to the gettering region; and
    patterning the crystallized semiconductor film so that the gettering region is removed,
    wherein the gettering region contains the group-13 impurity element at a concentration equal to or higher than that of the group-15 impurity element.

2. A method according to claim 1 wherein the crystallization promoting material comprises at least one element selected from the group consisting of Ni, Co, Fe, Pd, Pt, Cu, and Au.

3. A method according to claim 1 wherein the group-13 impurity element comprises at least one element selected from the group consisting of B, Al, Ga, In, and Tl.

4. A method according to claim 1 wherein the group-15 impurity element comprises at least one element selected from the group consisting of N, P, As, Sb, and Bi.

5. A method according to claim 1 wherein the gettering region contains the group-13 impurity element at a concentration by 1 to 3 times higher than that of the group-15 impurity element.

6. A method of manufacturing a semiconductor device comprising the steps of:
    forming a semiconductor film comprising amorphous silicon over a substrate;
    introducing a crystallization promoting material into the semiconductor film;
    crystallizing the semiconductor film;
    introducing a group-13 impurity element and a group-15 impurity element into a portion of the crystallized semiconductor film to form a gettering region;
    heating the crystallized semiconductor film so that the crystallization promoting material is moved to the gettering region; and
    patterning the crystallized semiconductor film so that at least a portion of the gettering region is removed,
    wherein the gettering region contains the group-13 impurity element at a concentration equal to or higher than that of the group-15 impurity element.

7. A method according to claim 6 wherein the crystallization promoting material comprises at least one element selected from the group consisting of Ni, Co, Fe, Pd, Pt, Cu, and Au.

8. A method according to claim 6 wherein the group-13 impurity element comprises at least one element selected from the group consisting of B, Al, Ga, In, and Tl.

9. A method according to claim 6 wherein the group-15 impurity element comprises at least one element selected from the group consisting of N, P, As, Sb, and Bi.

10. A method according to claim 6 wherein the gettering region contains the group-13 impurity element at a concentration by 1 to 3 times higher than that of the group-15 impurity element.

11. A method of manufacturing a semiconductor device comprising the steps of:

forming a gate electrode over a substrate;

forming a gate insulating film over the gate electrode, forming a semiconductor film comprising amorphous silicon over the gate insulating film;

introducing a crystallization promoting material into the semiconductor film;

crystallizing the semiconductor film;

introducing a group-13 impurity element and a group-15 impurity element into a portion of the crystallized semiconductor film to form a gettering region;

heating the crystallized semiconductor film so that the crystallization promoting material is moved to the gettering region; and patterning the crystallized semiconductor film so that the gettering region is removed, wherein the gettering region contains the group-13 impurity element at a concentration equal to or higher than that of the group-15 impurity element.

12. A method according to claim 11 wherein the crystallization promoting material comprises at least one element selected from the group consisting of Ni, Co, Fe, Pd, Pt, Cu, and Au.

13. A method according to claim 11 wherein the group-13 impurity element comprises at least one element selected from the group consisting of B, Al, Ga, In, and Tl.

14. A method according to claim 11 wherein the group-15 impurity element comprises at least one element selected from the group consisting of N, P, As, Sb, and Bi.

15. A method according to claim 11 wherein the gettering region contains the group-13 impurity element at a concentration by 1 to 3 times higher than that of the group-15 impurity element.

16. A method of manufacturing a semiconductor device comprising the steps of:

forming a gate electrode over a substrate;

forming a gate insulating film over the gate electrode, forming a semiconductor film comprising amorphous silicon over the gate insulating film;

introducing a crystallization promoting material into the semiconductor film;

crystallizing the semiconductor film;

introducing a group-13 impurity element and a group-15 impurity element into a portion of the crystallized semiconductor film to form a gettering region;

heating the crystallized semiconductor film so that the crystallization promoting material is moved to the gettering region; and patterning the crystallized semiconductor film so that at least a portion of the gettering region is removed, wherein the gettering region contains the group-13 impurity element at a concentration equal to or higher than that of the group-15 impurity element.

17. A method according to claim 16 wherein the crystallization promoting material comprises at least one element selected from the group consisting of Ni, Co, Fe, Pd, Pt, Cu, and Au.

18. A method according to claim 16 wherein the group-13 impurity element comprises at least one element selected from the group consisting of B, Al, Ga, In, and Tl.

19. A method according to claim 16 wherein the group-15 impurity element comprises at least one element selected from the group consisting of N, P, As, Sb, and Bi.

20. A method according to claim 16 wherein the gettering region contains the group-13 impurity element at a concentration by 1 to 3 times higher than that of the group-15 impurity element.

21. A method of manufacturing a semiconductor device comprising the steps of:

forming a semiconductor film comprising amorphous silicon over a substrate;

introducing a crystallization promoting material into the semiconductor film;

crystallizing the semiconductor film;

introducing a group-13 impurity element and a group-15 impurity element into a portion of the crystallized semiconductor film to form a gettering region;

heating the crystallized semiconductor film at a temperature of 400–1050° C. so that the crystallization promoting material is moved to the gettering region; and patterning the crystallized semiconductor film so that the gettering region is removed, wherein the gettering region contains the group-13 impurity element at a concentration equal to or higher than that of the group-15 impurity element.

22. A method according to claim 21 wherein the crystallization promoting material comprises at least one element selected from the group consisting of Ni, Co, Fe, Pd, Pt, Cu, and Au.

23. A method according to claim 21 wherein the group-13 impurity element comprises at least one element selected from the group consisting of B, Al, Ga, In, and Tl.

24. A method according to claim 21 wherein the group-15 impurity element comprises at least one element selected from the group consisting of N, P, As, Sb, and Bi.

25. A method according to claim 21 wherein the gettering region contains the group-13 impurity element at a concentration by 1 to 3 times higher than that of the group-15 impurity element.

26. A method of manufacturing a semiconductor device comprising the steps of:

forming a semiconductor film comprising amorphous silicon over a substrate;

introducing a crystallization promoting material into the semiconductor film;

crystallizing the semiconductor film;

introducing a group-13 impurity element and a group-15 impurity element into a portion of the crystallized semiconductor film to form a gettering region;

heating the crystallized semiconductor film at a temperature of 400–1050° C. so that the crystallization promoting material is moved to the gettering region; and patterning the crystallized semiconductor film so that at least a portion of the gettering region is removed, wherein the gettering region contains the group-13 impurity element at a concentration equal to or higher than that of the group-15 impurity element.

27. A method according to claim 26 wherein the crystallization promoting material comprises at least one element selected from the group consisting of Ni, Co, Fe, Pd, Pt, Cu, and Au.

28. A method according to claim 26 wherein the group-13 impurity element comprises at least one element selected from the group consisting of B, Al, Ga, In, and Tl.

29. A method according to claim 26 wherein the group-15 impurity element comprises at least one element selected from the group consisting of N, P, As, Sb, and Bi.

30. A method according to claim 26 wherein the gettering region contains the group-13 impurity element at a concentration by 1 to 3 times higher than that of the group-15 impurity element.

* * * * *